US007002388B2

(12) United States Patent
Nishikawa et al.

(10) Patent No.: US 7,002,388 B2
(45) Date of Patent: Feb. 21, 2006

(54) NONVOLATILE FLIP-FLOP CIRCUIT AND METHOD OF DRIVING THE SAME

(75) Inventors: Takashi Nishikawa, Nara (JP); Kenji Toyoda, Osaka (JP); Takashi Ohtsuka, Toyonaka (JP)

(73) Assignee: Matsushita Electric Co., Ltd., Osaka (JP)

( * ) Notice: Subject to any disclaimer, the term of this patent is extended or adjusted under 35 U.S.C. 154(b) by 0 days.

(21) Appl. No.: 11/080,454

(22) Filed: Mar. 16, 2005

(65) Prior Publication Data

US 2005/0206421 A1 Sep. 22, 2005

Related U.S. Application Data

(63) Continuation of application No. PCT/JP2004/017786, filed on Nov. 30, 2004.

(30) Foreign Application Priority Data

Dec. 4, 2003 (JP) ............................ 2003-405375

(51) Int. Cl.
*H03K 3/289* (2006.01)
*H03K 3/356* (2006.01)

(52) U.S. Cl. ...................... 327/203; 365/145; 365/154; 327/199; 327/200; 327/208; 327/209

(58) Field of Classification Search ................ 327/199, 327/200, 201, 202, 203, 208, 209, 210, 211, 327/212, 218; 365/145, 154
See application file for complete search history.

(56) References Cited

U.S. PATENT DOCUMENTS 6,314,016 B1 * 11/2001 Takasu ...................... 365/145

FOREIGN PATENT DOCUMENTS

| | | |
|---|---|---|
| JP | 09-027191 | 1/1997 |
| JP | 11-284500 | 10/1999 |
| JP | 2003-204257 | 7/2003 |

* cited by examiner

*Primary Examiner*—Kenneth B. Wells
*Assistant Examiner*—Khareem E. Almo
(74) *Attorney, Agent, or Firm*—McDermott Will & Emery LLP

(57) ABSTRACT

The present invention provides a method of driving a nonvolatile flip-flop circuit comprising the following steps of: a data hold step of holding an input data signal D utilizing polarization of a ferroelectric material of a ferroelectric gate transistor (601) when the data signal D is input while a first clocked inverter (604), a second clocked inverter (603), and a third switching element (602) are turned on and a first switching element (605), a second switching element (607), and a third clocked inverter (608) are turned off; and a data output step of outputting an output signal Q (−Q) based on the held data signal D placing the first clocked inverter (604), the second clocked inverter (603), and the third switching element (602) in the OFF state and placing the first switching element (605), the second switching element (607), and the third clocked inverter (608) in the ON state so as to interrupt an input of a data signal and maintain a polarization state of the ferroelectric material of the ferroelectric gate transistor (601).

30 Claims, 15 Drawing Sheets

(a)

(b)

NONVOLATILE FLIP-FLOP CIRCUIT AND METHOD OF DRIVING THE SAME

REFERENCE TO RELATED APPLICATION

This Application is a continuation of International Application No. PCT/JP2004/017786, whose international filing date is Nov. 30, 2004, which in turn claims the benefit of Japanese Application No. 2003-405375, filed Dec. 4, 2003, the disclosures of which Applications are incorporated by reference herein. The benefit of the filing and priority dates of the International and Japanese Applications is respectfully requested.

TECHNICAL FIELD

The present invention relates to a nonvolatile flip-flop circuit for use in shift registers, frame buffers and the like, and a method of driving the same.

BACKGROUND ART

Image-display devices, typified by liquid crystal displays, etc., performs high-speed image display by sequentially reading the data of one frame of an image into a temporary storage device referred to as a frame buffer, reading out the data in parallel at predetermined intervals, and then inputting the read out data to each pixel of an image-display device. The frame buffer is arranged in an array in the vicinity of an image-display panel of an image-display device, and comprises a circuit element referred to as a shift register. Such a shift register comprises two or more latch circuits and flip-flop circuits.

Hereinafter, these elements are described with reference to FIGS. 1 to 3. The image-display panel and frame buffer incorporated into an image-display device are described with reference to FIG. 1.

FIG. 1 illustrates an image-display panel 101, an X-axis (longitudinal) frame buffer 105, and a Y-axis frame buffer 106, with the image-display panel 101 comprising n×m pixels 102, n rows deep and m columns wide. Display or non-display of each pixel is determined by the overlapping of signals input from two signal lines; a signal line 103 in the longitudinal direction and a signal line 104 in the transverse direction. Signals are input to the signal lines; the signal line 103 in the longitudinal direction and the signal line 104 in the transverse direction, via the X-axis frame buffer 105 and the Y-axis frame buffer 106, respectively.

The X-axis frame buffer and the Y-axis frame buffer are configured in almost the same manner. The configuration is described in the following taking the X-axis frame buffer 105 as an example. The X-axis frame buffer 105 comprises at least one shift register 107 to which signals D are sequentially input by a signal input line 108 and to which at least one so-called clock signal is input so as to synchronize a circuit operation. In this case, two clock signals of CK1 and CK2 are input by clock signal lines 109 and 110.

The signals D sequentially input to the shift register 107 are transmitted to successive flip-flops in the shift register for each clock cycle in accordance with the clock signals, and thus the signals are input to the desired number of flip-flops. In accordance with the clock signal CK3 for outputting an image input via the clock signal line 111, the signals D are output in parallel to the image-display panel 101 from a signal output line 112.

The content of the shift register 107 is described with reference to FIGS. 2(*a*) and (*b*). FIG. 2(*a*) illustrates a shift register 201, the shift resister 201 being one of the shift registers 107 in the frame buffer 105 in FIG. 1, while FIG. 2(*b*) illustrates the details.

As shown in FIG. 2(*b*), the shift register herein is provided with a latch. More specifically, the shift register comprises a shift-register portion 202 and a latch portion 203.

The shift-register portion 202 includes two or more flip-flops 204, and the respective flip-flops 204 are connected to each other by a signal line 205 to which a signal D is input, and a clock line 206 to which a clock signal is input. The latch portion 203 also includes two or more flip-flops 204, and the individual flip-flops 204 in the latch portion 203 are connected to the individual flip-flops 204 in the shift-register portion 202 by the signal line 207 to which a signal D is input. A clock line 208 is connected to the individual flip-flops 204 in the latch portion 203, and a second clock signal CK2 is input thereto by the clock line 208.

An output signal line 209 extends from the individual flip-flops 204 in the latch portion 203. A gate 210 is connected to each output signal line 209, and an output signal is input to the image panel in accordance with the clock signal input from the clock line 206. The signals input sequentially are transmitted to the individual flip-flops in the shift register for each clock cycle of the clock signals, and the signals are then transmitted to the desired number of flip-flops. Values input to the individual flip-flops for each clock timing are held at a latch portion. The data held at the latch portion 203 are output in parallel at the desired timing in accordance with the clock signal CK3 supplied to a gate 210, thereby displaying an image on the image panel.

The content of the flip-flop in the shift register is described with reference to FIGS. 3(*a*) and (*b*). Details of this flip-flop are given in, for example, "How to use a flip-flop", Transistor GIJUTSU (transistor technology) SPECIAL, CQ Publishing Co., Ltd., No. 58, pp. 114–127.

FIG. 3(*a*) illustrates details of the flip-flop 204 of FIG. 2(*b*). As shown in FIG. 3(*a*), the flip-flop comprises an inverter and a clocked inverter. The input signal D is input to an inverter 301 via a first clocked inverter 302, and subsequently the output of the inverter 301 is fed back to the input of the inverter 301 through a second clocked inverter 303. In other words, the portion surrounded by a dotted line 304 serves as a first feedback circuit.

The output of the first feedback circuit 304 is input to a second inverter 306 via a third clocked inverter 305. Subsequently, the output of the second inverter 306 is fed back to the input of the second inverter 306 via a fourth clocked inverter 307. In other words, the portion surrounded by a dotted line 308 serves as a second feedback circuit.

The output of the second inverter 306 is output as the output Q of this flip-flop, and a signal fed back to the input of the second inverter 306 is output as −Q which is inverted to the output Q, (designated "Q bar", which may be represented as "$\overline{Q}$"). The first feedback circuit 304 is referred to as a master latch, and the second feedback circuit 308 is referred to as a slave latch. A flip-flop circuit thus configured is referred to as a master-slave flip-flop circuit.

A clock signal is input to each clocked inverter from a clock circuit 309. Under the state shown in FIG. 3(*a*), an inverted clock signal −CK, which is inverted to the clock signal CK, is input to the first and fourth clocked inverters (302, 307), and a clock signal CK is input to the second and third clocked inverters (303, 305). Thus, the master latch and the slave latch are configured such that a signal is transmitted from the master latch to the slave latch for each clock cycle, which avoids signal transmission to both the master latch and the slave latch within one clock cycle.

The clock circuit 309 is not always incorporated into a flip-flop circuit, and it may be provided externally. In general, a clocked inverter is configured as shown in FIG. 3(*b*). The phase of a clock signal supplied to an n-channel MOSFET in which the source is grounded is opposite to that of a clock signal supplied to a p-channel MOSFET in which the source is connected to the power supply.

Prior-art flip-flop circuits configured as above are difficult to reduce the power consumption thereof because there is the necessity of continuously supplying power for storing the input data so as to avoid data loss caused by power supply interruption.

In the case of power supply interruption, data preceding power supply interruption need to be input again to a flip-flop circuit for outputting, resulting in a loss in processes. Also, since prior-art flip-flop circuits need to supply power throughout the circuit to read out data stored in the flip-flop circuit, there is room for improvement in terms of reducing the power consumption in this point.

DISCLOSURE OF THE INVENTION

The invention has been made to solve the above-described problems, and an object of the invention is to provide a nonvolatile flip-flop circuit which can achieve power consumption reduction, and a method of driving the same.

The object can be achieved by a nonvolatile flip-flop circuit according to the invention, the nonvolatile flip-flop circuit comprises: a first clocked inverter 604 to which a data signal D is input; a ferroelectric gate transistor 601 in which a gate is connected to an output terminal of the first clocked inverter 604, and a source and a body are electrically connected; a second clocked inverter 603 which is connected in parallel to the ferroelectric gate transistor 601; a first switching element 605, one end of which is connected to the gate of the ferroelectric gate transistor 601 and the other end of which is connected to a low potential line; a second switching element 607, one end of which is connected to the source of the ferroelectric gate transistor 601 and the other end of which is connected to the low potential line; a third clocked inverter 608 which is connected to a drain of the ferroelectric gate transistor 601; a third switching element 602, one end of which is connected to an input terminal of the third clocked inverter 608 and the other end of which is connected to a power supply; and a fourth switching element 606, one end of which is connected to the input terminal of the third clocked inverter 608 and the other end of which is connected to the power supply; wherein an output signal Q (−Q) is output via an output terminal of the third clocked inverter 608.

In the configuration of the above-described flip-flop circuit, a method of driving the nonvolatile flip-flop circuit according to the invention comprises the following steps of: a data hold step of holding an input data signal D utilizing polarization of a ferroelectric material of the ferroelectric gate transistor 601 when the data signal D is input while the first clocked inverter 604, the second clocked inverter 603, and the third switching element 602 are turned on and the first switching element 605, the second switching element 607, and the third clocked inverter 608 are turned off; and a data output step of outputting an output signal Q (−Q) based on the held data signal D placing the first clocked inverter 604, the second clocked inverter 603, and the third switching element 602 in the OFF state and placing the first switching element 605, the second switching element 607, and the third clocked inverter 608 in the ON state so as to interrupt an input of a data signal D and maintain a polarization state of the ferroelectric material of the ferroelectric gate transistor 601.

A nonvolatile flip-flop circuit according to another embodiment of the invention comprises: a first clocked inverter 504 to which a data signal D is input; a ferroelectric gate transistor 501 in which a gate is connected to an output terminal of the first clocked inverter 504, and a source and a body are electrically connected; a second clocked inverter 503 which is connected in parallel to the ferroelectric gate transistor 501; a first switching element 505, one end of which is connected to the gate of the ferroelectric gate transistor 501 and the other end of which is connected to a low potential line; a second switching element 506, one end of which is connected to the source of the ferroelectric gate transistor 501 and the other end of which is connected to the low potential line; a third clocked inverter 507, one end of which is connected to a drain of the ferroelectric gate transistor 501; a resistive element 502, one end of which is connected to an input terminal of the third clocked inverter 507 and the other end of which is connected to a power supply; wherein an output signal Q (−Q) is output via an output terminal of the third clocked inverter 507.

In the configuration of the above-described flip-flop circuit, a method of driving a nonvolatile flip-clop circuit according to another embodiment comprises the following steps of: a data hold step of holding an input data signal D utilizing polarization of a ferroelectric material of the ferroelectric gate transistor 501 when the data signal D is input while the first clocked inverter 504 and the second clocked inverter 503 are turned on and the first switching element 505, the second switching element 506, and the third clocked inverter 507 are turned off; and a data output step of outputting an output signal Q (−Q) based on the held data signal D placing the first clocked inverter 504 and the second clocked inverter 503 in the OFF state and placing the first switching element 505, the second switching element 506, and the third clocked inverter 507 in the ON state so as to interrupt an input of a data signal D and maintain a polarization state of the ferroelectric material of the ferroelectric gate transistor 501.

BRIEF DESCRIPTION OF THE DRAWINGS

FIG. 10(*a*) refers to a circuit employing a prior-art nonvolatile flip-flop circuit and FIG. 10(*b*) refers to a circuit employing a nonvolatile flip-flop circuit of the invention.

BEST MODE FOR CARRYING OUT THE INVENTION

Figure 1:
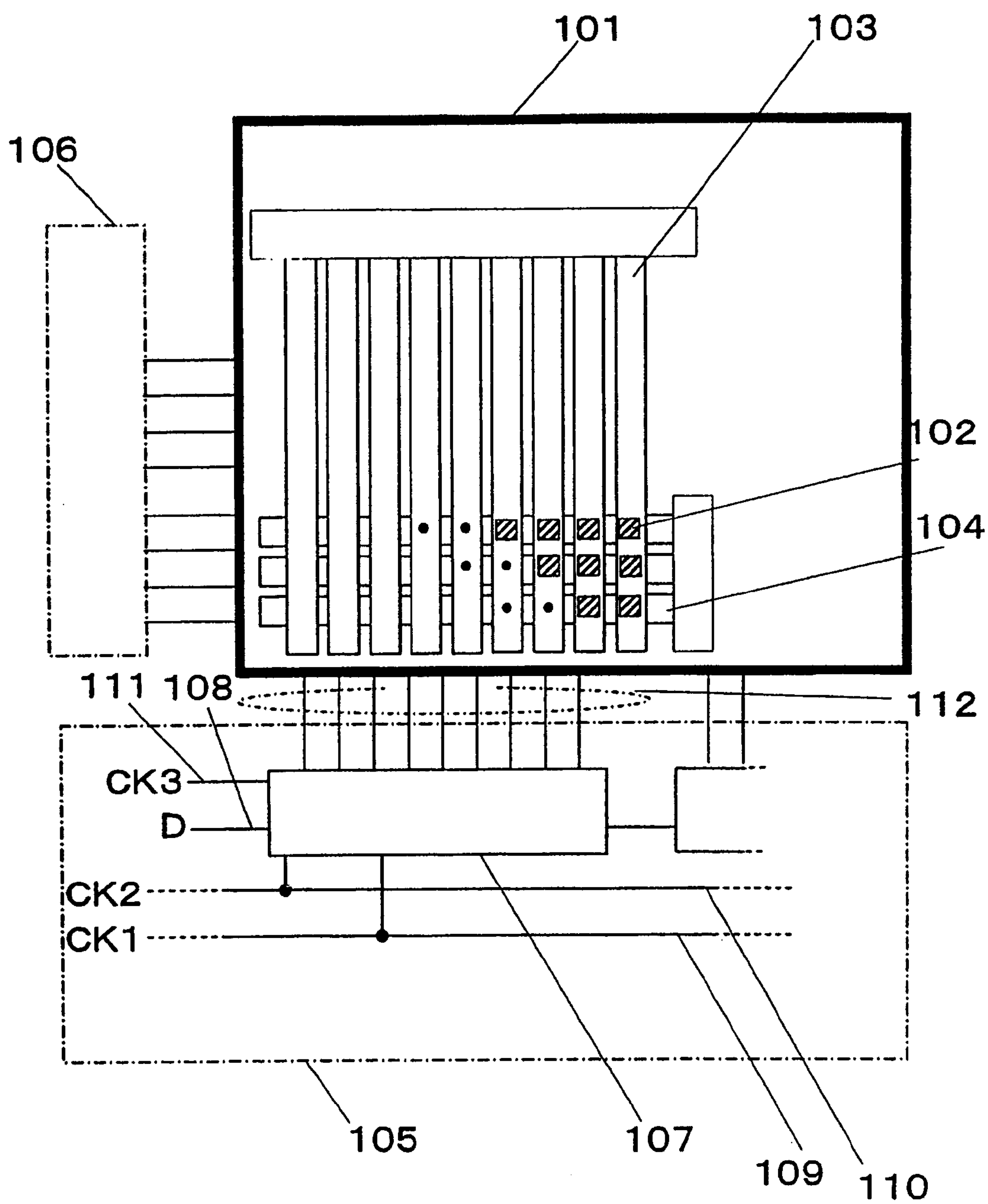
FIG. 1 is a view illustrating the configuration of a prior-art image-display device and a frame buffer.
Figure 2:
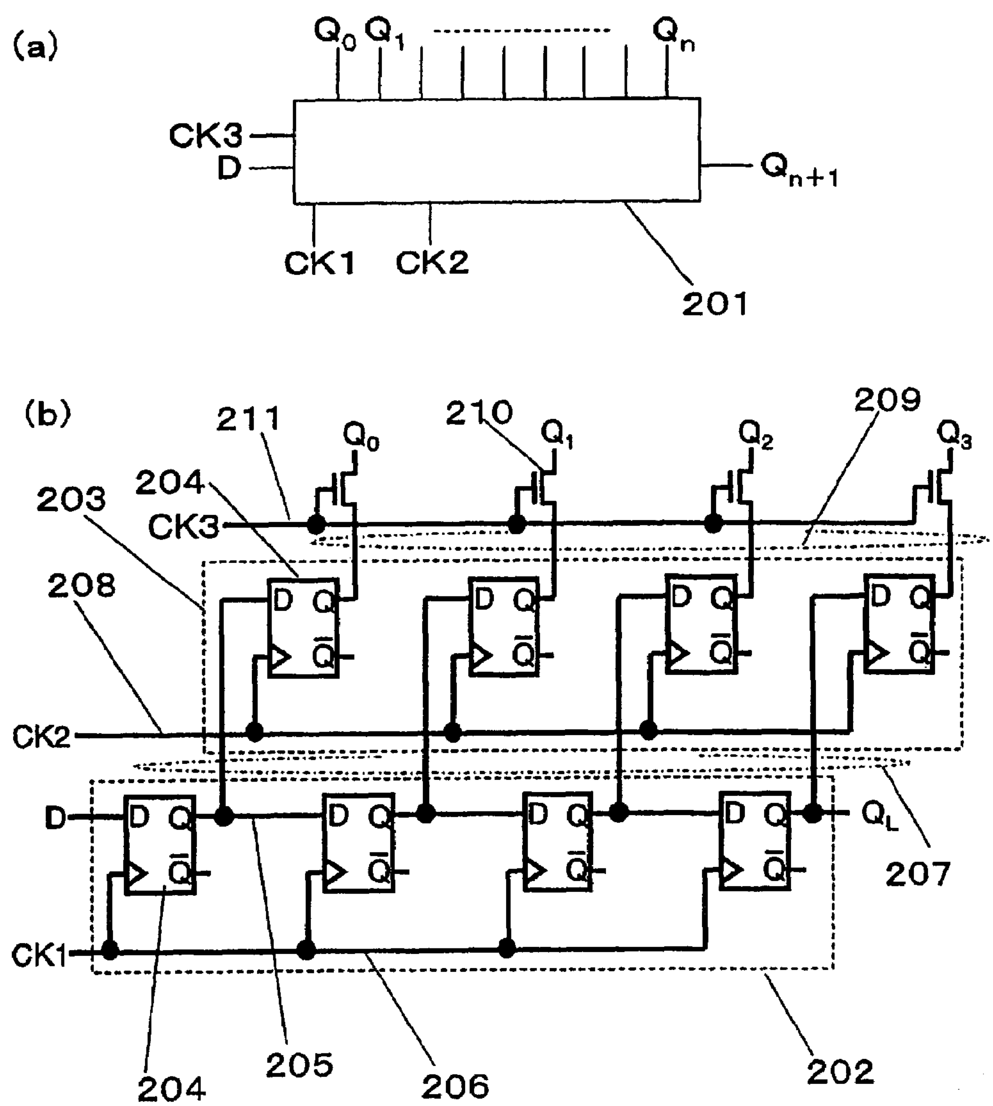
FIGS. 2(*a*) and (*b*) are views illustrating the configuration of a prior-art shift register.
Figure 3:
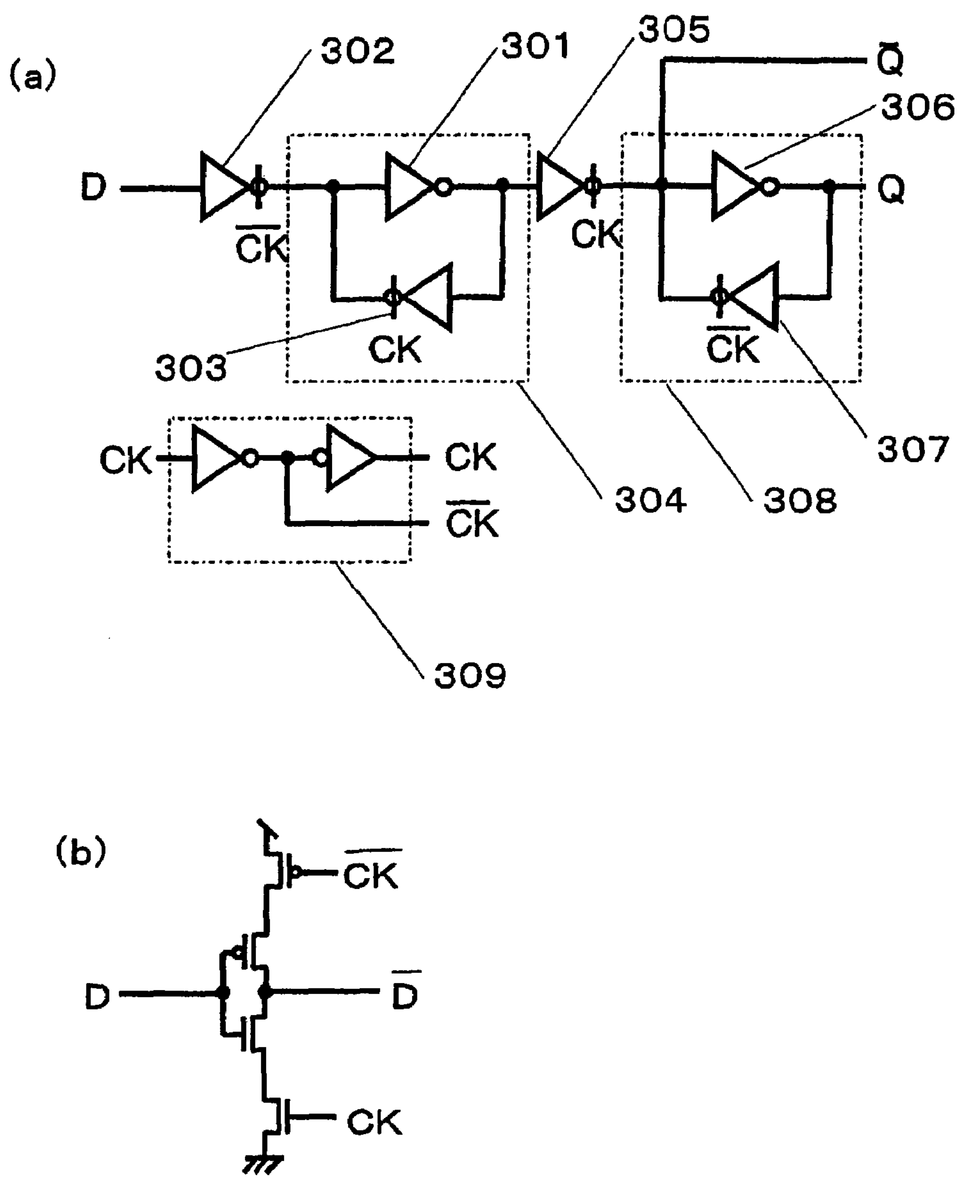
FIGS. 3(*a*) and (*b*) are circuit diagrams illustrating a prior-art master-slave flip-flop circuit.
Figure 4:
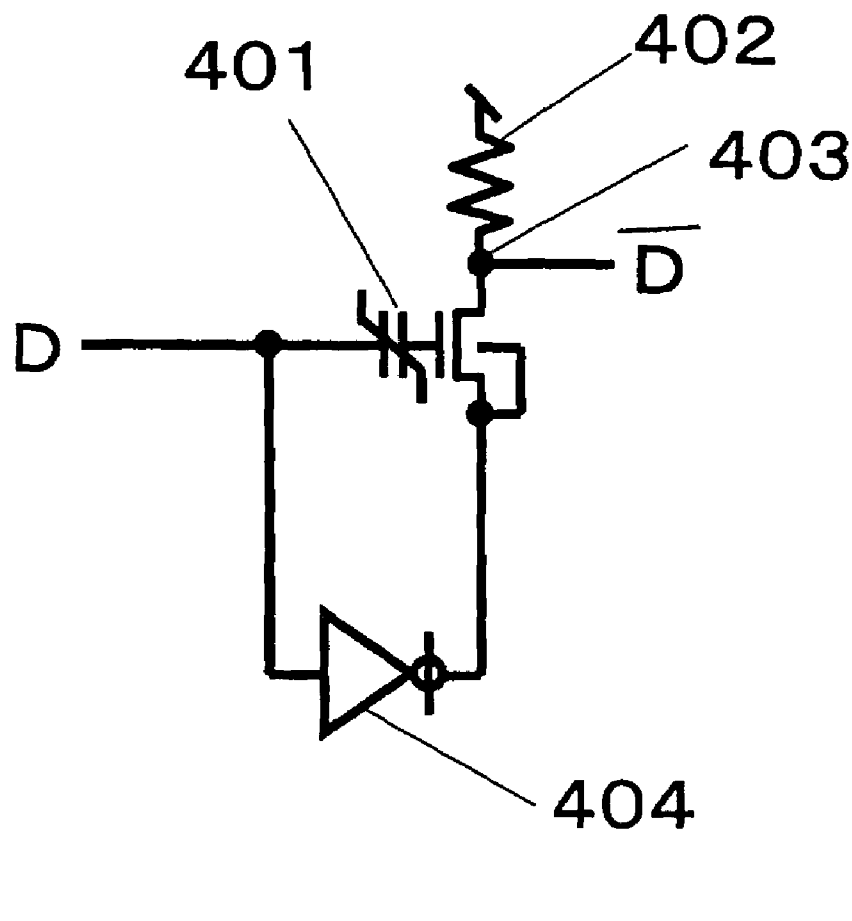
FIG. 4 is a circuit diagram illustrating a nonvolatile inverter circuit of a nonvolatile flip-flop circuit according to one embodiment of the invention.
Figure 5:
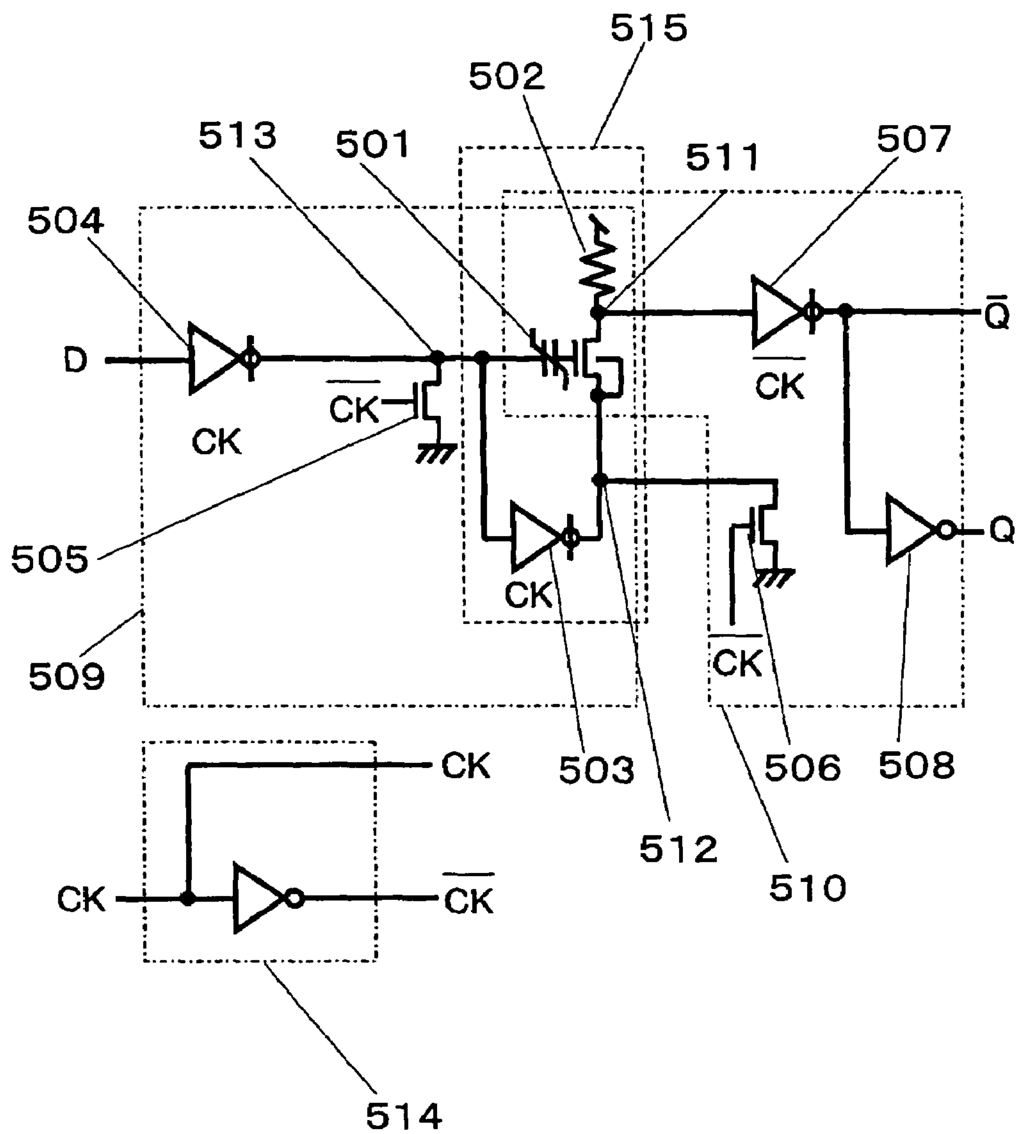
FIG. 5 is a circuit diagram illustrating a nonvolatile flip-flop circuit according to one embodiment of the invention.

Embodiments of the present invention are described below with reference to the accompanying drawings. FIG. 4 is a view illustrating the configuration of a nonvolatile inverter circuit incorporated into a nonvolatile flip-flop circuit according to one embodiment of the invention. FIG. 5 is a view illustrating the configuration of a nonvolatile flip-flop circuit according to one embodiment of the invention.

The nonvolatile inverter circuit shown in FIG. 4 is provided with a ferroelectric gate transistor 401, a resistive element 402, and a clocked inverter 404. The ferroelectric gate transistor 401 employs a ferroelectric thin film as a gate insulation film. One end of the resistive element 402 is connected to a drain of the ferroelectric gate transistor 401 and the other end thereof is connected to a power supply. The input of the clocked inverter 404 is parallel to the input of the gate of the ferroelectric gate transistor 401, and the output of the clocked inverter 404 is connected to a source of the ferroelectric gate transistor 401. The source of the ferroelectric gate transistor 401 is connected electrically to the body (substrate). The ferroelectric gate transistor 401 may be configured in such a manner that a gate electrode is formed on the ferroelectric thin film, or that a gate electrode is connected to a conductive layer formed on the ferroelectric thin film via wiring.

Herein, it is assumed that a binary signal derived from a positive power supply potential and a ground potential is input to the nonvolatile inverter circuit. This binary signal is usually input to a digital circuit, and the values are represented by “high (H)” or “low (L)”.

First, we consider the case where a positive potential is supplied to the gate of the ferroelectric gate transistor 401. In this case, the output of the clocked inverter 404 becomes the ground potential, thereby rendering the potential of the source and the body (substrate) the ground potential. Thus, a positive potential gradient occurs.

The positive potential gradient causes polarization of the ferroelectric capacitor of the ferroelectric gate transistor 401, thereby inducing a positive potential taking a certain finite value in a floating gate electrode of the ferroelectric gate transistor 401. Thus, the threshold of the ferroelectric gate transistor 401 decreases, resulting in the reduced channel resistance. In other words, the transistor turns ON. The power supply potential applied to the resistive element 402 is divided using the resistance ratio of the resistance value of the resistive element 402 to the channel resistance value of the ferroelectric gate transistor 401.

Provided that both the resistance values are such that the channel resistance value of the ferroelectric gate transistor 401 is sufficiently small as compared to the resistance value of the resistive element 402 at the time that the channel of the ferroelectric gate transistor 401 is placed in a low resistance state due to a positive potential induced to the floating gate, the output will be inverted with respect to the input. This is because the output potential appearing at a connected node 403 of the resistive element 402 and the ferroelectric gate transistor 401 substantially becomes the ground potential. In this case, the output is maintained in the inverted state insofar as the polarization state of the ferroelectric material is maintained and no signal is input because the fall of the channel resistance of the ferroelectric gate transistor 401 is caused by polarization of the ferroelectric material.

In contrast, when a ground potential is supplied to the ferroelectric gate transistor 401, the output of the clocked inverter 404 becomes a positive power supply potential, which increases the potential of the source of the ferroelectric gate transistor 401 and the body electrically connected to the source. Thus, a negative potential gradient occurs between the gate and the body. Accordingly, the ferroelectric capacitor of the ferroelectric gate transistor 401 is polarized in the opposite direction to the above, thereby inducing a negative potential in the floating gate electrode. As a result, the threshold of the ferroelectric gate transistor 401 increases to raise the channel resistance. In other words, the transistor turns OFF. A power supply potential applied to the resistive element 402 is divided by the resistive element 402 and the ferroelectric gate transistor 401 with increased channel resistance value.

Provided that both the resistance values are such that the channel resistance value of the ferroelectric gate transistor 401 is sufficiently large as compared to the resistance value of the resistive element 402 at the time that the channel of the ferroelectric gate transistor 401 is placed in a high resistance state due to a negative potential induced in the floating gate, the output will be inverted with respect to the input. This is because the output potential appearing at the connected node 403 of the resistive element 402 and the ferroelectric gate transistor 401 substantially becomes a positive power supply potential. In this case, the output is maintained in the inverted state insofar as the polarization of the ferroelectric material is maintained and no signal is input because the rise of the channel resistance value of the ferroelectric gate transistor 401 is caused by polarization of the ferroelectric material.

As described above, the configuration shown in FIG. 4 allows the ferroelectric material to be polarized in either positive or negative direction by inputting either of a positive power supply potential or a ground potential as a signal, thereby outputting an output signal inverted to the binary value of either the ground potential or the positive power supply potential. All that is necessary in this configuration is to provide a positive power supply and a positive ground wire as in prior-art inverter circuits; a negative power supply is not required for input. Also, this configuration can achieve a nonvolatile inverter in which data can be retained even if the power supply is interrupted because data can be stored in the ferroelectric gate transistor 401.

Hereinafter, a flip-flop circuit employing the nonvolatile inverter configured as above is described with reference to FIG. 5. FIG. 5 illustrates a flip-flop circuit including the above-described nonvolatile inverter. A nonvolatile inverter 515 shown in FIG. 5 corresponds to the nonvolatile inverter circuit shown in FIG. 4.

In the configuration shown in FIG. 5, a source and a body of a ferroelectric gate transistor 501 are connected electrically, and a drain of the ferroelectric gate transistor 501 is connected to one end of a resistive element 502. The other end of the resistive element 502 is connected to a power supply. An input signal is applied to the gate of the ferroelectric gate transistor 501. The potential at a connected node 511 of the ferroelectric gate transistor 501 and the resistive element 502 becomes the output. The input of the ferroelectric gate transistor 501 is parallel to the input of a second clocked inverter 503. The output of the second clocked inverter 503 is connected to the source of the ferroelectric gate transistor 501.

A first clocked inverter 504 is provided in the former stage which is the input side of a nonvolatile inverter 515. Between the first clocked inverter 504 and the nonvolatile inverter 515 is connected a drain of an n-channel MOSFET 505 serving as a first switching element in which a source is grounded (see a node designated by the reference numeral 513). A drain of an n-channel MOSFET 506 serving as a second switching element in which a source is grounded is connected to the source of the ferroelectric gate transistor 501 (see a node designated by the reference numeral 512). A third clocked inverter 507 is provided in the later stage of an output 511 of the nonvolatile inverter 515. An output inverter 508 is connected to a further later stage of the third clocked inverter 507.

In the configuration shown in FIG. 5, the portion surrounded by the dotted line 509 denotes a master latch and the portion surrounded by the dotted line 510 denotes a slave latch. The master latch 509 comprises the first clocked inverter 504 provided in the former stage of the input side of the nonvolatile inverter 501, the n-channel MOSFET 505, and the nonvolatile inverter 515. The nonvolatile inverter 515 is provided with the ferroelectric gate transistor 501, the resistive element 502, and the second clocked inverter 503. The slave latch 510 comprises the ferroelectric gate transistor 501, the resistive element 502, the n-channel MOSFET 506, the third clocked inverter 507, and the output inverter 508. The phase of the clock signal input to each clocked inverter and n-MOSFET is as shown by "CK" or "−CK" ($\overline{CK}$) in each element of FIG. 5. The phase of "$\overline{CK}$" is inverted 180 degrees to that of "CK". The clock signal is input by a clock circuit 514 in the nonvolatile flip-flop circuit shown in FIG. 5. It is not always necessary that a separate clock circuit 514 be provided for each flip-flop circuit, and a configuration such that a clock signal is supplied from an external element is acceptable.

The above-described configuration can achieve the following effects. The master latch 509 and the slave latch 510 are configured such that a signal is transmitted from the master latch 509 to the slave latch 510 for each clock cycle, while avoiding a signal from transmitting to both the master latch and the slave latch within one clock cycle. Also, it is possible to provide a nonvolatile master-slave flip-flop which can read the data preceding power supply interruption, if this might occur, simply by supplying power and a clock signal to the slave latch 510, because data is stored at the nonvolatile inverter 515. Further, according to the nonvolatile master-slave flip-flop, data once written in the internal nonvolatile inverter 515 can be read out repeatedly as required simply by supplying power and a clock signal to the slave latch 510. Therefore, the power consumption can be reduced as compared to prior-art flip-flop circuits. A method of driving a flip-flop circuit is explained in details in various Embodiments of the invention described later.

Figure 6:
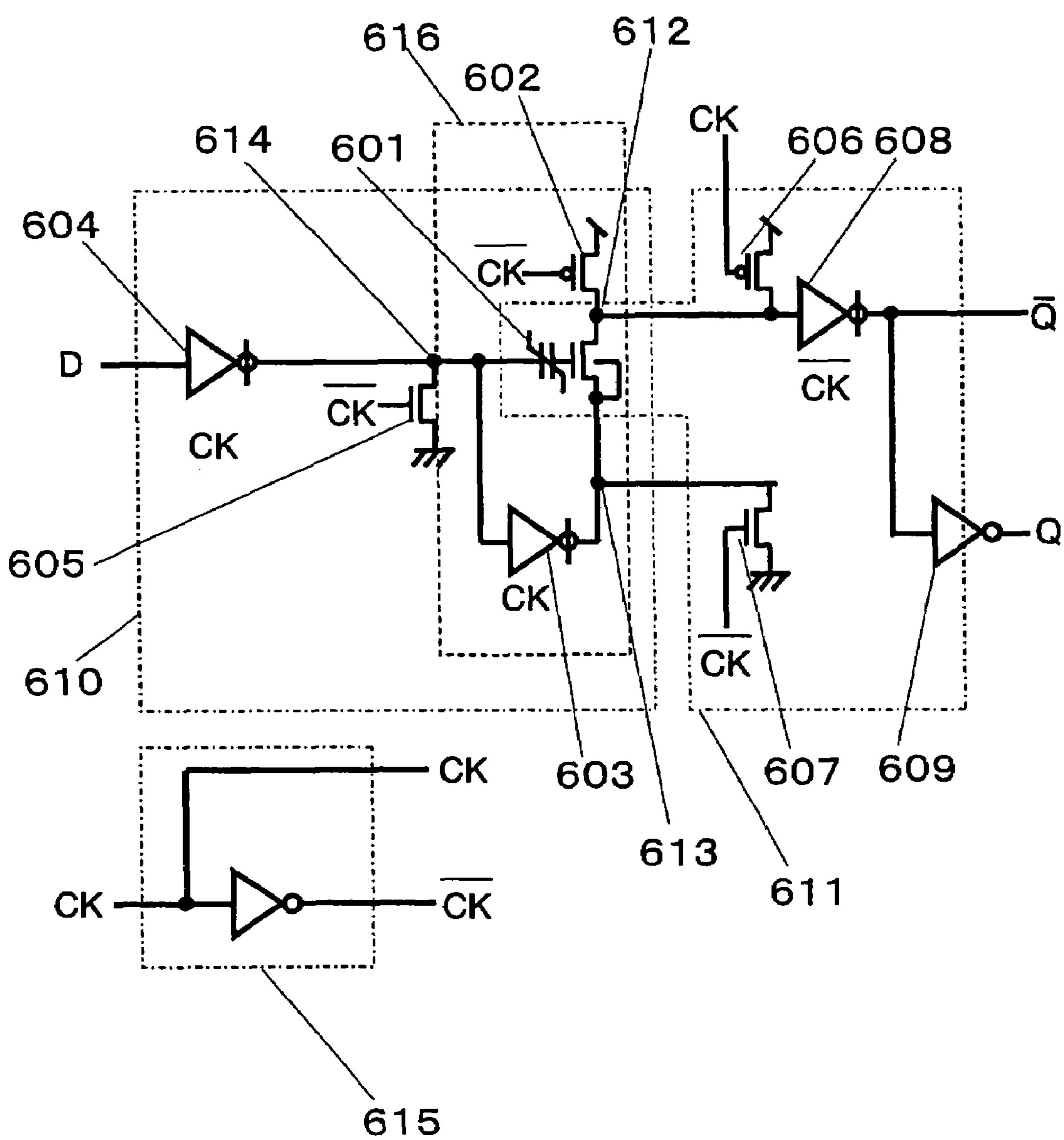
FIG. 6 is a circuit diagram illustrating a nonvolatile flip-flop circuit according to another embodiment of the invention.

Hereinafter, the configuration of a nonvolatile flip-flop circuit according to another Embodiment of the invention is described with reference to FIG. 6. The basic configuration of the flip-flop circuit shown in FIG. 6 is similar to that of the nonvolatile flip-flop circuit shown in FIG. 5. More specifically, two p-channel MOSFETs are provided in place of the resistive element 502 of the nonvolatile inverter 515 shown in FIG. 5. One end of each p-channel MOSFET is connected to an input terminal of a third clocked inverter 507, and the other end thereof is connected to a power supply. The configuration of the flip-flop circuit shown in FIG. 6 is given below.

A source and a body of a ferroelectric gate transistor 601 are connected electrically. The drain of the ferroelectric gate transistor 601 and a p-channel MOSFET 602 serving as a third switching element are connected in series. The p-channel MOSFET 602 is an enhancement p-channel MOSFET, and the source is connected to the power supply.

A potential applied to the gate of the ferroelectric gate transistor 601 is the input, and a potential 612 at a connected node of the ferroelectric gate transistor 601 and the p-channel MOSFET 602 is the output. The input of the second clocked inverter 603 is provided parallel to the input of the ferroelectric gate transistor 601. The output of the second clocked inverter 603 is connected to the source of the ferroelectric gate transistor 601. According to the nonvolatile inverter 616 thus configured, when a signal taking either one of the binary value, a ground potential or a positive power supply potential, is input, data is written or rewritten by converting the potential applied to the ferroelectric material of the ferroelectric gate transistor 601 to a finite potential taking the binary value, each having the opposite sign.

A first clocked inverter 604 is provided in the former stage of the input of the nonvolatile inverter 616. The drain of an n-channel MOSFET 605 serving as a first switching element in which the source is grounded is connected between the first clocked inverter 604 and the nonvolatile inverter 616 (see a node designated by the reference numeral 614). A drain of an n-channel MOSFET 607 serving as a second switching element in which the source is grounded is connected to the source of the ferroelectric gate transistor 601 (see a node designated by the reference numeral 613). A third clocked inverter 608 is provided in the later stage of an output of the nonvolatile inverter 616. An output inverter 609 is connected to a further later stage of the third clocked inverter 608. A drain of a p-channel MOSFET 606 as a fourth switching element is connected between the output of the nonvolatile inverter 616 and the third clocked inverter 608 provided in the later stage of the output of the nonvolatile inverter 616. The source of the p-channel MOSFET 606 is connected to the power supply.

In FIG. 6, the portion surrounded by the dotted line 610 is a master latch 610, which comprises the first clocked inverter 604, the n-channel MOSFET 605, and the nonvolatile inverter 616. The nonvolatile inverter 616 is provided with the ferroelectric gate transistor 601, the enhancement p-channel MOSFET 602, and the second clocked inverter 603.

The portion surrounded by the dotted line 611 is a slave latch 611, which comprises the n-channel MOSFET 607, the third clocked inverter 608, the p-channel MOSFET 606, the ferroelectric gate transistor 601, and the output inverter 609.

In the configuration shown in FIG. 6, this flip-flop circuit can be used as a master-slave flip-flop by inverting clock signals supplied to the master latch 610 and the slave latch 611. The phase of the clock signal input to each clocked inverter, n-MOSFET, and p-MOSFET is as shown by "CK" or "−CK" ($\overline{CK}$) in each element of FIG. 6. The phase of "$\overline{CK}$" is inverted 180 degrees to that of "CK". The clock signal is input by the clock circuit 615 in the nonvolatile flip-flop circuit shown in FIG. 6. It is not always necessary that a separate clock circuit 615 be provided for each flip-flop circuit, and a configuration such that a clock signal is supplied from an external element is acceptable. This configuration allows the flip-flop circuit of FIG. 6 to function as a nonvolatile master-slave flip-flop, and thus data once written can be read out repeatedly as required simply by supplying power and a clock signal to the slave latch 611, thereby reducing power consumption as compared to the prior art in the same manner as in the flip-flop circuit configured shown in FIG. 5.

Figure 7:
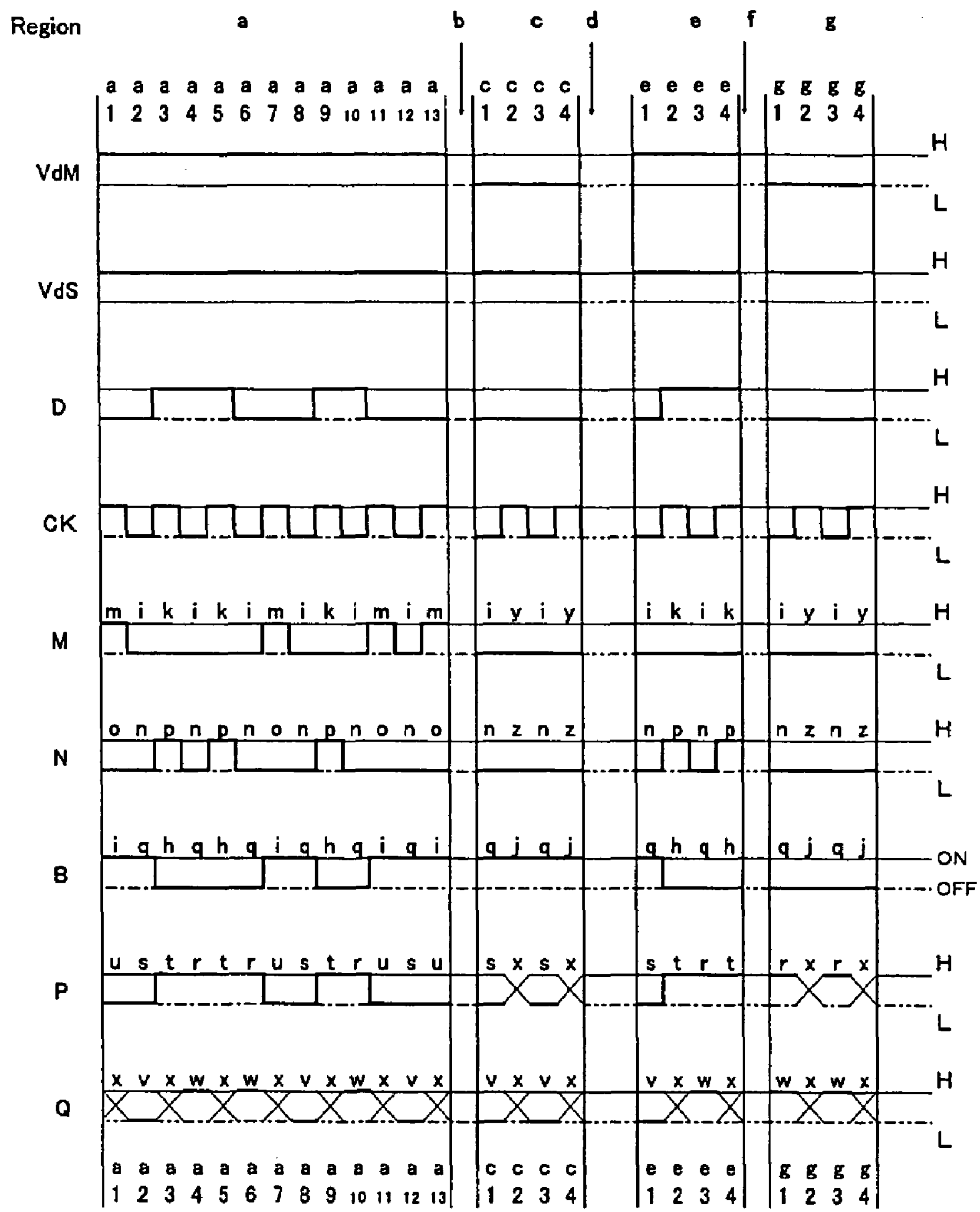
FIG. 7 is a timing chart illustrating an operation of each node in the nonvolatile flip-flop circuit shown in FIG. 6.
Figure 8:
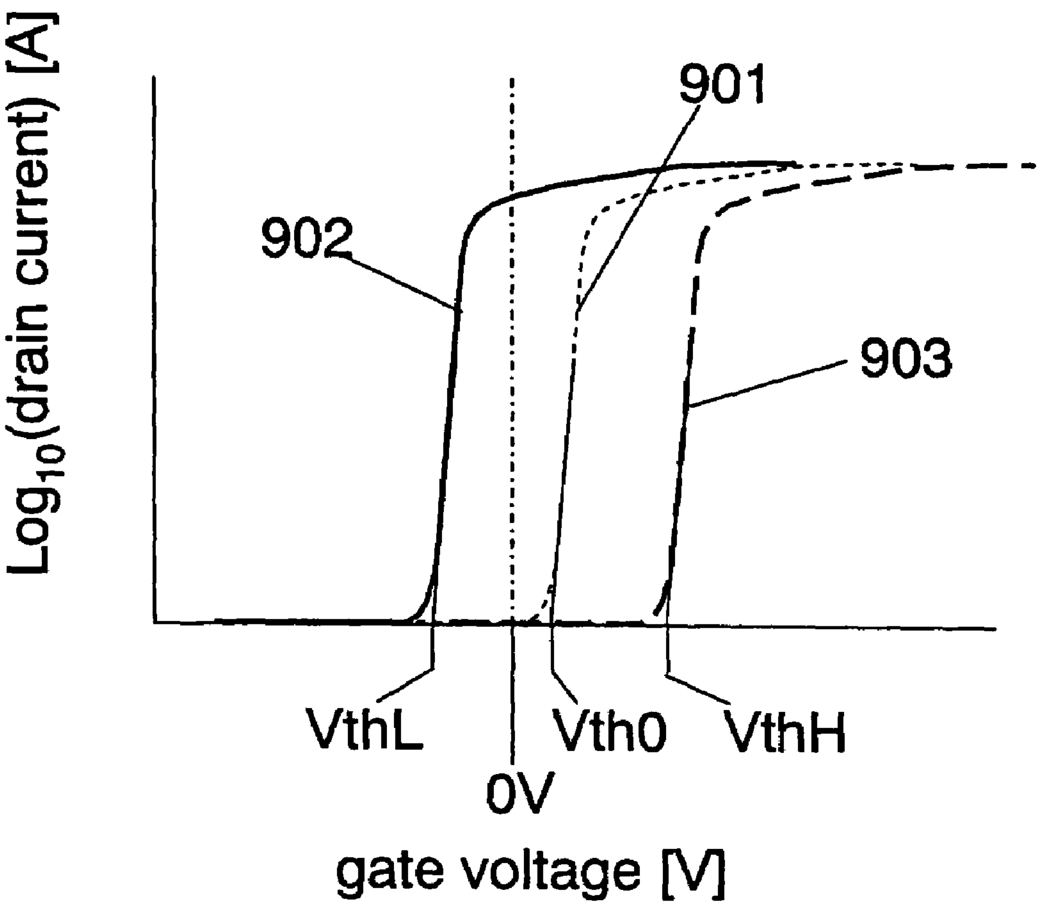
FIG. 8 is an Id-Vg diagram showing the relationship between a drain current of a ferroelectric gate transistor and a gate voltage thereof in the nonvolatile flip-flop circuit shown in FIG. 6.

The timing chart shown in FIG. 7 shows that operation of each node in the nonvolatile flip-flop circuit of FIG. 6. varies with the passage of time. FIG. 8 is a view illustrating the relationship between the drain current and the gate voltage of the ferroelectric gate transistor in the nonvolatile flip-flop circuit shown in FIG. 6. FIGS. 9A to 9D are views for explaining the signal flow at each given timing. Hereafter, operations of the nonvolatile flip-flop circuit shown in FIG. 6 are described in details with reference to FIGS. 7, 8, and 9A to 9D.

"VdM" in FIG. 7 represents the potential applied to the power supply of the master latch 610 of FIG. 6. "VdS" represents the potential applied to the power supply of the slave latch 611 of FIG. 6. "D" and "CK" represent an input signal and a clock signal, respectively. "M" represents the potential at the node 614 in FIG. 6, "N" represents the potential at the node 613 in FIG. 6, and "P" represents the potential at the node 612 in FIG. 6. "B" shows whether the ferroelectric gate transistor 601 in FIG. 6 is in the ON state or the OFF state.

In regions "a" and "e" in FIG. 7, the power, clock, and signal are continuously applied. This timing chart shows that the master-slave flip-flop circuit according to this Embodiment operates in the same manner as in prior-art master-slave flip-flops.

In regions "b", "d" and "f" in FIG. 7, the power, clock, and signal are not applied. In prior-art master-slave flip-flops, data preceding the power supply interruption is erased when the power supply is interrupted.

In regions "c" and "g" in FIG. 7, the power and clock signal are applied only to the slave latch. According to prior-art master-slave flip-flops, data is not read out even if the power and clock signal are applied only to the slave latch. In contrast, according to the nonvolatile master-slave flip-flop of this embodiment, data immediately preceding power supply interruption is retained, and can be read repeatedly, not only once.

Referring to FIG. 8, operations of the ferroelectric gate transistor are described for both the cases, ON and OFF states. FIG. 8 is a view showing the relationship between the drain current (Id) and the gate applied voltage (Vg) of the ferroelectric gate transistor. Hereinafter, FIG. 8 is referred to as the "Id-Vg diagram" and the line of FIG. 8 is referred to as the "Id-Vg line."

The Id-Vg line 901 shows the relationship between the drain current (Id) and the gate applied voltage (Vg) when the ferroelectric material laminated on the gate in the ferroelectric gate transistor is unpolarized. This shows that the ferroelectric gate transistor of the invention operate in the same manner as in typical field-effect transistors, and the threshold, Vth, in this case might possibly be about 0.1V (see Vth0 in FIG. 8).

When the voltage is higher than the threshold Vth0, the transistor turns ON and becomes low in resistance, thereby obtaining a high current Id. In contrast, when the voltage is lower than the threshold Vth0, the transistor turns OFF and becomes high in resistance, thereby providing a current Id reduced by several orders of magnitude as compared to the ON state. More specifically, data is not retained after removing the voltage, because the transistor turns OFF irrespective of the voltage applied to the gate. In practice, since the ferroelectric material is polarized by applying to the gate a voltage higher than a predetermined amount, the circuit state is as described below.

Id-Vg line 902 shows the relationship between the drain current (Id) and the gate applied voltage (Vg) when a positive signal sufficient to polarize the ferroelectric material is once applied to the gate and the ferroelectric layer is polarized. In this case, the apparent threshold potential shifts to the low-voltage side since a positive potential is induced in the floating electrode of the gate by polarization of the ferroelectric material. The amount of shift sharply varies depending on the configuration of the elements, and it can be about 0.3V, for example. As a result, the threshold potential (VthL) is −0.2V. In this case also, when the voltage is higher than the threshold VthL, the transistor turns ON and becomes low in resistance, thereby obtaining a high current Id. In contrast, when the voltage is lower than the threshold VthL, the transistor turns OFF and becomes high in resistance, thereby providing a current Id reduced by several orders of magnitude as compared to the ON state. This means that a transistor in this state always turns ON when a positive signal is input as a gate voltage, and the elements of the transistor are maintained in the ON state even when the apparent applied voltage becomes 0V by removing the gate voltage. In other words, data is stored and retained not only when the positive signal is applied to the gate but even after removing the signal. Thus, the elements are held in the ON state.

Id-Vg line 903 shows the relationship between the drain current (Id) and the gate applied voltage (Vg) when a negative signal sufficient to polarize the ferroelectric material is once applied to the gate and the ferroelectric layer is polarized.

The apparent threshold potential shifts to the high-voltage side since a negative potential is induced in the floating electrode of the gate by polarization of the ferroelectric material. The amount of shift sharply varies depending on the configuration of the elements, and it can be about 0.3V, for example. As a result, the threshold potential (VthH) is 0.4V. In this case also, when the voltage is higher than the threshold VthL, the transistor turns ON and becomes low in resistance, thereby obtaining a high current Id. In contrast, when the voltage is lower than the threshold VthL, the transistor turns OFF and becomes high in resistance, thereby providing a current Id reduced by several orders of magnitude as compared to the ON state. This means that the transistor in this state always turns OFF when a negative signal is input as a gate voltage, and the elements of the transistor are held in the OFF state even when the apparent applied voltage becomes 0V by removing the gate voltage. In other words, data is stored and retained not only when the negative signal is applied to the gate but even after removing the signal. Thus, the elements are held in the OFF state.

As described above, the threshold voltage of the gate can be sharply varied by polarizing the ferroelectric material to the opposite direction by applying a signal to the gate. As a result, the ON and OFF states of elements can be stored and held after the gate voltage is removed (namely, the gate voltage=0V).

The signal state change is described with reference to FIGS. 9A to 9D. FIGS. 9A to 9D show the current state and the state change of each node when a signal D and a clock signal CK are input in the circuit shown in FIG. 6. Additional reference characters in FIGS. 9A to 9D represent the following states or operations.

The reference character "o" shown in the second clocked inverters 603, 604, and 608, denotes that each clocked inverter turns ON and the input is inverted. The reference character "x" denotes that each clocked inverter turns OFF to be in high-impedance state, whereby neither "H" nor "L" is output in response to an input signal. The reference character "☆" ("open star") shown in the n-channel MOSFETs 605 and 607, and the p-channel MOSFETs 602 and 606, and the ferroelectric gate transistor 601 denotes that each transistor turns ON. The reference character "★" ("filled-in star") denotes that a transistor turns OFF. With respect to arrows shown in the vicinity of each wiring, a solid arrow denotes that the indicated part is in the "H" state, and a dashed arrow denotes that the indicated part is in the "L" state.

Figure 9A:
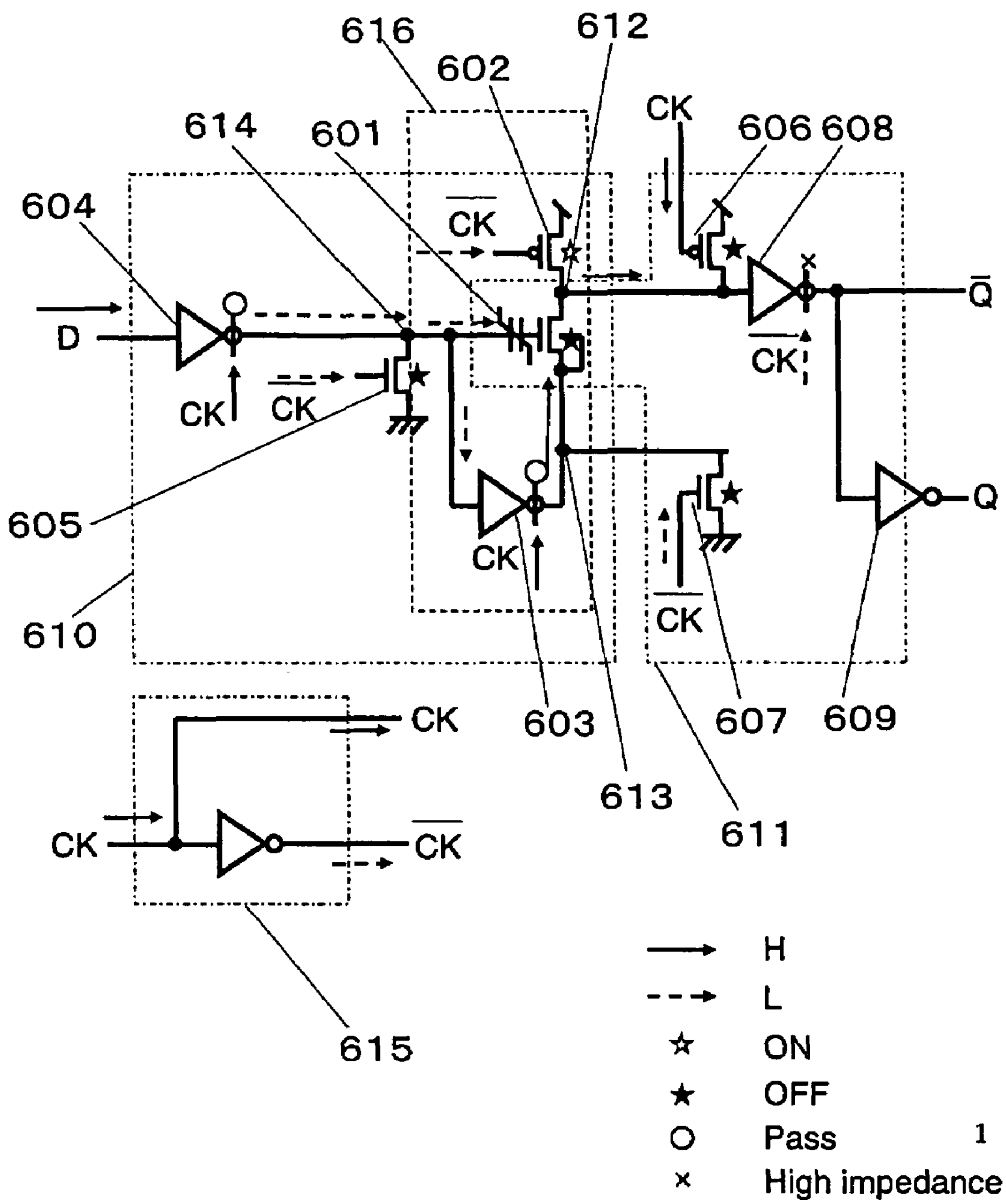
FIGS. 9A to 9D are diagrams illustrating the signal flow at each given timing in the nonvolatile flip-flop circuit shown in FIG. 6.

The state shown in FIG. 9A is described. FIG. 9A shows the state of a nonvolatile flip-flop circuit during a data hold step in the first half of the first clock cycle when "H" is input as a signal D, i.e., CK=H.

When "H" is input as a signal D, the value is inverted by the first clocked inverter 604 in the ON state to result in the "L" state at a node M614. The value is further inverted by the second clocked inverter 603 to result in the "H" state at a node N613. In other words, "L" is applied to the gate and "H" is applied to the body in the ferroelectric gate transistor 601. Therefore, the ferroelectric material is polarized to turn the channel OFF.

In this state, the n-channel MOSFETs 605 and 607 turn "OFF" by the application of "L". Therefore, the nodes M614 and N613 are unaffected. In contrast, the p-channel MOSFET 602 turns ON since a signal CK is inverted and applied thereto, i.e., application of −CK=L when CK=H. The potential of a node P612 is set to "H" by setting the channel resistance value of the ferroelectric gate transistor 601 in the OFF state to be sufficiently large (for example, approximately 100 times) with respect to the channel resistance value of the p-channel MOSFET 602 in the ON state. It should be noted that, with respect to the description "the channel resistance value being sufficiently large", the resistance ratio is not limited to the above-mentioned value insofar as the potential of the node P612 can be clearly identified as "H".

In contrast, the third clocked inverter 608 is placed in a high-impedance state by the application of "L", the value of which is inverted with respect to the clock CK. Therefore, nothing is output to "Q" and "−Q" ($\overline{Q}$) in the later stage. More specifically, the output at this time is undefined.

Figure 9B:
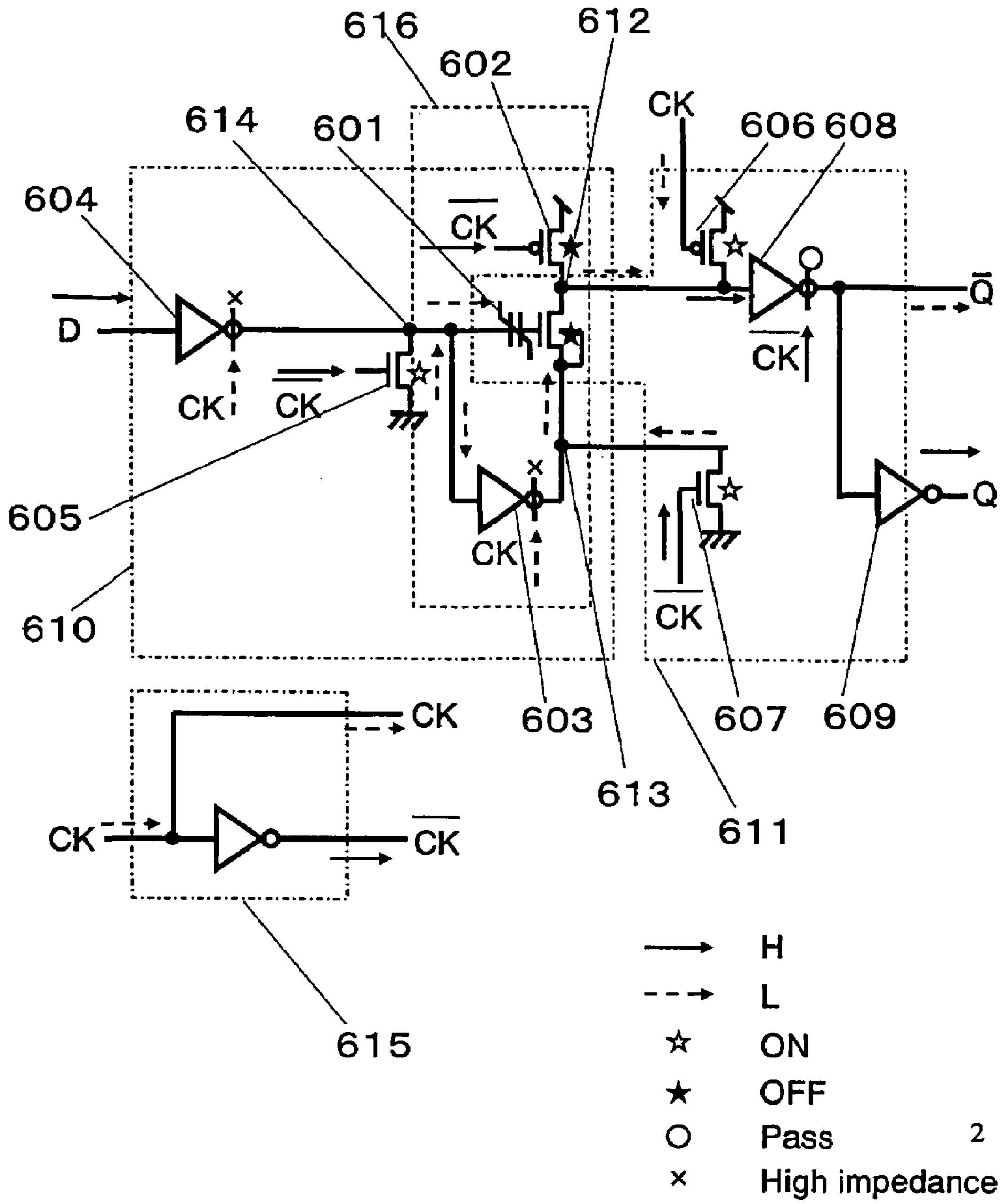

The state shown in FIG. 9B is described below. FIG. 9B shows the state of a nonvolatile flip-flop circuit during a data output step in the second half of the first clock cycle when "H" is input as a signal D, i.e., CK=L.

In this state, the first clocked inverter 604 turns OFF since the clock signal is in the "L" state to be in a high-impedance state. Therefore, the later stage including the slave latch 611 is unaffected by the value of the input signal D. The n-channel MOSFET 605 in which the source is grounded turns ON by the application of an inverted clock signal. Thus, the node M614 is reset to "L".

The second clocked inverter 603 is similarly placed in high impedance. The node N is reset to "L" since the n-channel MOSFET 607, in which the source is grounded, turns ON. Thus, "L" is applied to both the gate and the body of the ferroelectric gate transistor 601, thereby maintaining the polarization state. Therefore, the value in the first half of the clock CK in FIG. 9A is held (that is, the OFF state is maintained).

The p-channel MOSFET 602, the source of which is connected to the power supply, turns OFF by the application of an inverted clock signal. In contrast, the p-channel MOSFET 606, the source of which is connected to the power supply, turns ON. As previously described in the above with regard to the state shown in FIG. 9A, the potential of the node P612 is set to "H" because the channel resistance value of the ferroelectric gate transistor 601 in the OFF state is set to be sufficiently large (for example, approximately 100 times) with respect to the channel resistance value of the p-channel MOSFET 606 in the ON state. It should be noted that with respect to the description "the channel resistance value being sufficiently large", the resistance ratio is not limited to the above-mentioned value insofar as the potential of the node P612 can be clearly identified as "H".

The potential of the node P612 is-output to Q and −Q since an inverted clock signal is applied to the third clocked inverter 608 provided in the later stage of the p-channel MOSFET 606. In other words, the value of a signal D=H input to the master latch 610 in the first half of a clock cycle is output as an output Q=H in the second half of the clock cycle.

Figure 9C:
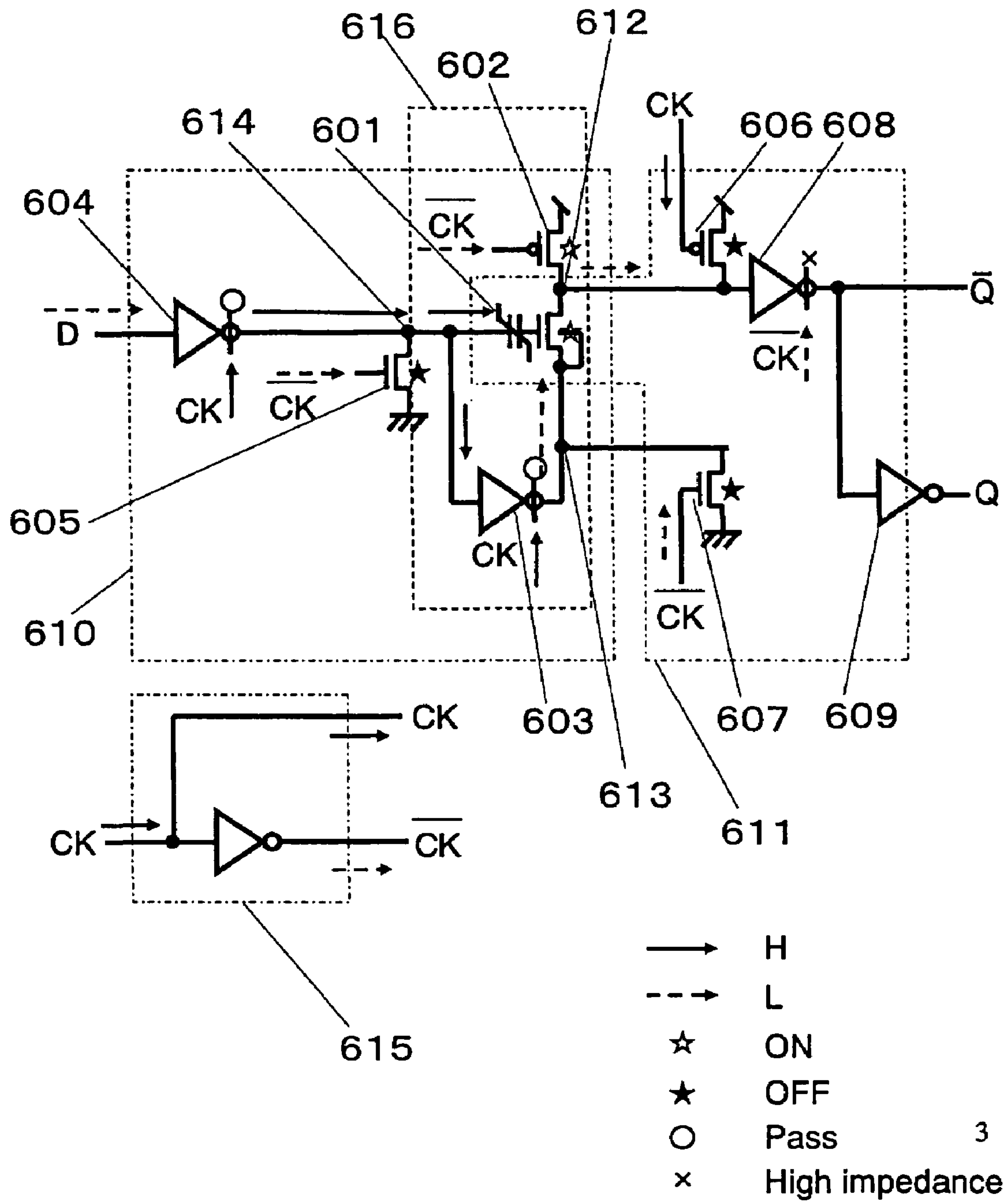

The state shown in FIG. 9C is described below. FIG. 9C shows the state of a nonvolatile flip-flop circuit during a data hold step in the first half of the first clock cycle when "L" is input as a signal D, i.e., CK=H.

In this state, since the first clocked inverter 604 turns ON, the input signal D is inverted and passed to the node M614, whereby the node M614 is placed in the "H" state. In contrast, the n-channel MOSFET 605 does not turn ON because an inverted clock signal is applied thereto, and therefore the node M614 is unaffected.

Similarly, since the second clocked inverter 603 is also in the ON state, the value of the node M614 is inverted and transmitted to a node N613 to result in the "L" state at the node N613. Thus, the ferroelectric material is polarized to turn the channel ON because "H" is applied to the gate and "L" is applied to the body in the ferroelectric gate transistor 601.

At this time, the n-channel MOSFETs 605 and 607 turn OFF by the application of "L". Therefore, the nodes M614 and N613 are unaffected. In contrast, the p-channel MOSFET 602 turns ON since a signal CK is inverted and applied thereto, i.e., an application of −CK=L when CK=H. The potential of a node P612 is set to "L" by setting the channel resistance value of the ferroelectric gate transistor 601 in the ON state to be sufficiently small (for example, approximately 1/100) with respect to the channel resistance value of the p-channel MOSFET 602 in the ON state. It should be noted that, with respect to the description "the channel resistance value being sufficiently small", the resistance ratio is not limited to the above-mentioned value insofar as the potential of the node P612 can be clearly identified as "L".

In contrast, the third clocked inverter 608 is placed in a high-impedance state by the application of "L", the value of which is inverted with respect to that of the clock signal CK. Therefore, nothing is output to the later stage including the slave latch 611. More specifically, the output at this time is undefined.

Figure 9D:
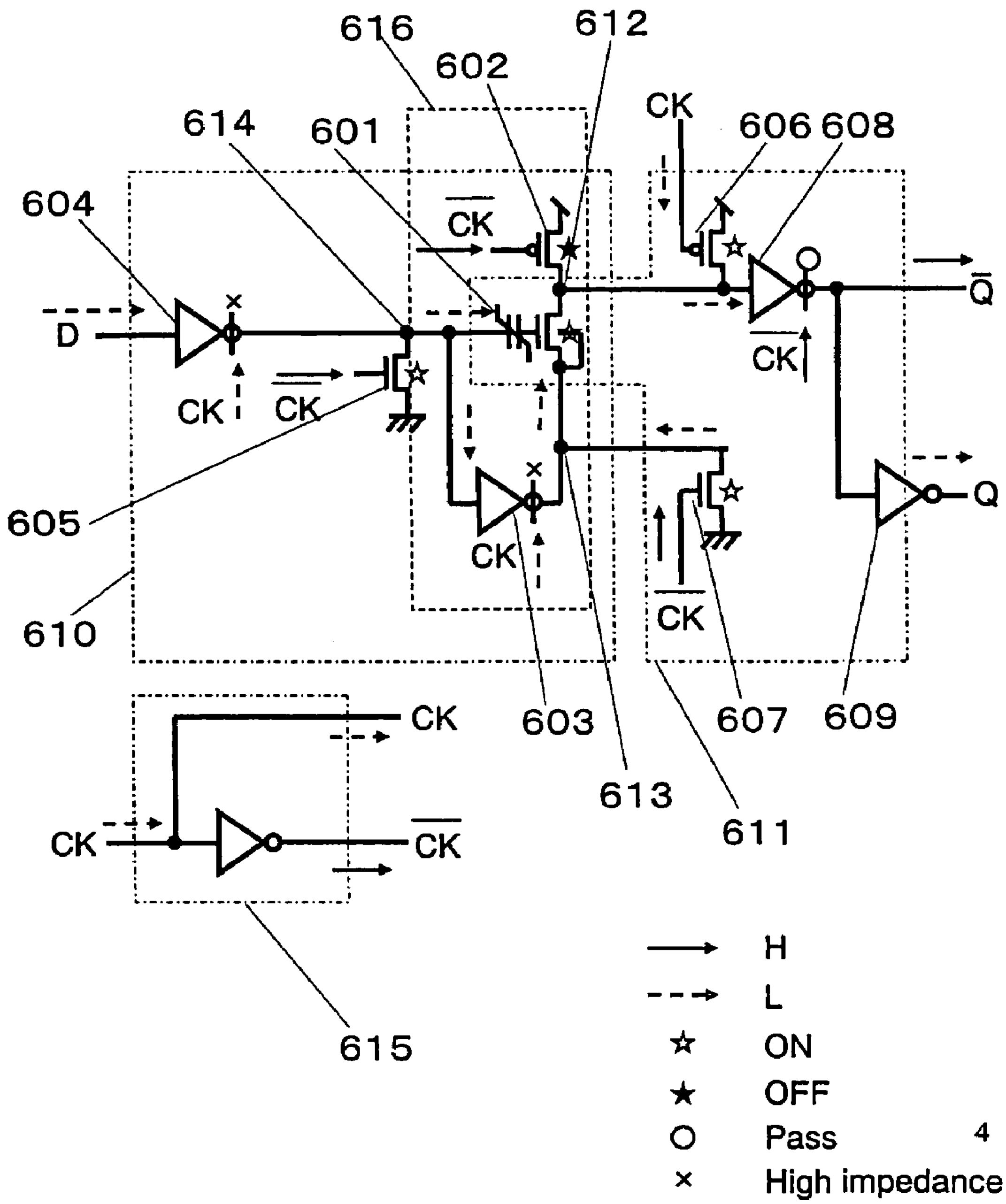

The state shown in FIG. 9D is described below. FIG. 9D shows the state of a nonvolatile flip-flop circuit during a data output step in the second half of the first clock cycle when "L" is input as a signal D, i.e., CK=L.

In this state, since the clock signal is "L", the first clocked inverter 604 turns OFF, resulting in a high-impedance state. Therefore, the later stage is unaffected by the value of the input signal D. The n-channel MOSFET 605 in which the source is grounded turns ON by the application of an inverted clock signal, whereby the node M614 is reset to "L".

The second clocked inverter 603 is placed in a high impedance state similarly. Since the n-channel MOSFET 607, in which the source is grounded, turns ON, the node N is reset to "L". Thus, "L" is applied to both the gate and the body of the ferroelectric gate transistor 601, thereby maintaining the polarization state. Therefore, the value in the first half of the clock CK in FIG. 9C is held (that is, the ON state is maintained).

The p-channel MOSFET 602, the source of which is connected to the power supply, turns OFF by the application of an inverted clock signal. In contrast, the p-channel MOSFET 606, the source of which is connected to the power supply, turns ON. As previously described in the above with regard to the state shown in FIG. 9C, the potential of the node P612 is set to "L" since the channel resistance value of the ferroelectric gate transistor 601 in the ON state to be sufficiently small (for example, approximately 1/100) with respect to the channel resistance value of the p-channel MOSFET 606 in the ON state. More specifically, a signal "H" transmitted from the power supply connected to the p-channel MOSFET 606 leaks to the lower potential line through the n-channel MOSFET in the ON state after passing through channels of the p-channel MOSFET in the ON state and the ferroelectric gate transistor 601 with sufficiently reduced channel resistance value. It should be noted that, with respect to the description "the channel resistance value being sufficiently small", the resistance ratio is not limited to the above-mentioned value insofar as the potential of the node P612 can be clearly identified as "L".

The potential of the node P612 is output to Q and −Q since an inverted clock signal is applied to the third clocked inverter 608 provided in the later stage of the p-channel MOSFET 606. In other words, the value of the signal D=L input to the master latch in the first half of a clock cycle is output as the output Q=L in the second half of the clock cycle.

Turning to FIG. 7, operations of the non-volatile master-slave flip-flop according to the present embodiment are described again based on the above-description.

Two power supply potentials, VdM and VdS, are always in the "H" state in the area "a", which shows that both the master latch and the slave latch are operating. That is, the signal is written to the master latch when the clock signal CK is in the state of "H", and in contrast, the signal is read out from the slave latch when the clock signal is in the state of "L". As can be seen from FIG. 7, the initial state of a signal D happens to be "L", and the state switches between "H" and "L" at desired intervals. The initial state of a clock CK happens to be "H", and subsequently the state changes to "L", and then the state keeps switching between "H" and "L" at a certain cycle.

The states of nodes of M, N, B, P, and Q, are determined in accordance with the input signal D and the clock CK. The relationship therebetween is shown below with respect to each node, which are specified on the chart of FIG. 7 where, for Node M614, i: "L" state irrespective of the input signal D when −CK=H (CK=L), k: "L" state when CK=H and D=H, m: "H" state when CK=H and D=L, and y: "L" state irrespective of the input signal D when VdM=L and CK=H.

Node N, n: "L" state irrespective of the node M when −CK=H (CK=L), o: "L" state when CK=H and M=H, p: "H" state when CK=H and M=L, and z: "L" state irrespective of the node M when VdM=L and CK=H.

The ferroelectric gate transistor state B, q: the preceding value irrespective of the node M when −CK=H (CK=L), h: "OFF" state when CK=H and M=L, i: "ON" state when CK=H and M=H, and j: the preceding value irrespective of anything when M=L and N=L.

Node P612, r: "H" state if B=OFF when −CK=H (CK=L), s: "L" state if B=ON when −CK=H (CK=L), t: "H" state if B=OFF when CK=H, u: "L" state if B=ON when CK=H, and x: undefined when VdM=L and CK=H.

Output Q, v: "L" state if P=L when −CK=H (CK=L), w: "H" state if P=H when −CK=H (CK=L), and x: undefined irrespective of the node P when CK=H.

Hereinafter, a shift register employing the nonvolatile flip-flop circuit according to each Embodiment of the invention described above is described.

In such a shift register, even if power supply and the input of a clock signal to the shift register are interrupted, the data preceding the power supply interruption can be read out simply by supplying power and re-inputting a clock signal to a slave latch. Therefore, the speed of reading out data can be accelerated because the data preceding the power supply interruption can be read out without inputting the data again.

Further, the data preceding the power supply interruption does not need to be stored in an external storage device, which eliminates the need to provide another circuit for re-inputting the data from a device external to the circuit and supplying power to drive the circuit. In addition, such a shift register also has the advantage of eliminating the time required for re-inputting the data.

Also, data once input can be read-out repeatedly simply by supplying power and inputting a clock signal to the slave latch. Therefore, there is no need to provide a feedback circuit for feeding the output back to the input, which eliminates the power for driving the feedback circuit and the time required for the feedback operation.

In an image framebuffer employing the above shift register, even if the power supply and the input of a clock signal to the image frame are interrupted, data preceding power supply interruption can be read out simply by supplying power and inputting a clock signal. Thus, the speed of reading out data can be accelerated because data preceding power supply interruption can be read out without re-inputting the data. Further, the data preceding power supply interruption does not need to be stored in an external storage device, which eliminates the necessity of providing another circuit for re-inputting the data from an a device external to the circuit and supplying the power for driving the circuit. In addition, such an image framebuffer can eliminate the time required for re-inputting the data. Also, since data once input can be read-out repeatedly simply by supplying power and inputting a clock signal, there is no need to provide a feedback circuit for feeding the output back to the input. As a result, power for driving a feedback circuit and the time required for the feedback can be eliminated.

According to the above-described framebuffers in prior-art image display devices, the input data can be read out only once, not repeatedly, and the output data needs to be fed back to the input so as to display the same image. This necessitates providing a feedback circuit to feedback the output data to the input, which requires extra power consumption for the feedback operation. As described above, the framebuffer according to this embodiment can avoid such problems.

The above-described prior-art image-display devices need to continuously apply voltage to the whole image framebuffer comprising a flip-flop so as to continuously display the same image, which poses a problem of increasing the power consumption. However, this problem can be avoided by the configuration of this embodiment. According to the configuration of this embodiment, data input once can be read out repeatedly. Thus, it is possible to provide a non-volatile image framebuffer and an image display device using the same in which the power consumption and the circuit scale are reduced, and further, even if the power supply is interrupted, the image data preceding the power supply interruption is retained and can be readout repeatedly without additionally providing any feedback circuit.

Further, it is also possible to achieve home electrical equipment employing such image-display devices. Examples of such electrical equipment includes equipment intended primarily for functions other than image display, such as cellular phones. Cellular phones employing the configuration of this embodiment serve as an extremely ideal product because extended use can be achieved by reducing the power consumption. Further, the configuration of this embodiment is suitable for reducing the size and thickness of cellular phones because the circuit scale can be reduced. Furthermore, the reduced circuit scale facilitates installation of other function modules, thereby easily enabling performance enhancement. Unlike cellular phones, electronic advertising systems, etc. can be mentioned as electronic equipment intended primarily for image display. Such an electronic advertising system can noticeably exhibit the effects of reducing power consumption and circuit scale, and, even if the power supply is interrupted, retaining image data preceding the power supply interruption.

Incorporating the above-mentioned shift register into an arithmetic circuit makes it possible to hold and use data being calculated or the data of the final output in the arithmetic circuit, thus eliminating the need to temporarily save the data in a storage device installed separately from the arithmetic circuit.

This makes it possible to reduce wiring connected to a component external to the arithmetic circuit, thereby minimizing the circuit scale inside the arithmetic circuit. In addition, the circuit scale, including any peripheral circuit, can be reduced by eliminating the external storage device itself. As a result, the necessity of exchanging data with an external storage device during an operation can be eliminated, thereby reducing the number of operating steps and reducing the time required for calculation, which accelerates the speed of performing an operation and lowers the power consumption. Further, reduced power consumption can be achieved even when data is temporarily saved in the arithmetic circuit, because there is no necessity of applying a voltage from the power supply until the data is re-used.

All that is necessary to read out data from the shift register while no new data is input thereto is to apply voltage from the power supply only to a slave latch. Therefore, the electric power applied to a master latch can be eliminated, thereby reducing electric power consumption. In addition, since data being calculated or the data of the final output can be repeatedly used simply by applying voltage from the power supply only to a slave latch, the necessity of providing another feedback circuit can be eliminated. As a result, the circuit scale can be further reduced as compared to the usual circuit scale, thereby reducing power consumption.

Incorporating this arithmetic circuit into a large scale integrated circuit (LSI) makes it possible to continuously store data in the shift register included in the circuit, thereby eliminating the area required for a storage device, which is usually installed in a large scale integrated circuit. As a result, the circuit scale of a large scale integrated circuit can be reduced, thereby reducing manufacturing costs. Further, the high-speed operation and low power consumption of the arithmetic circuit make it possible to achieve high-speed operation and low power consumption in the large scale integrated circuit.

Figure 10:
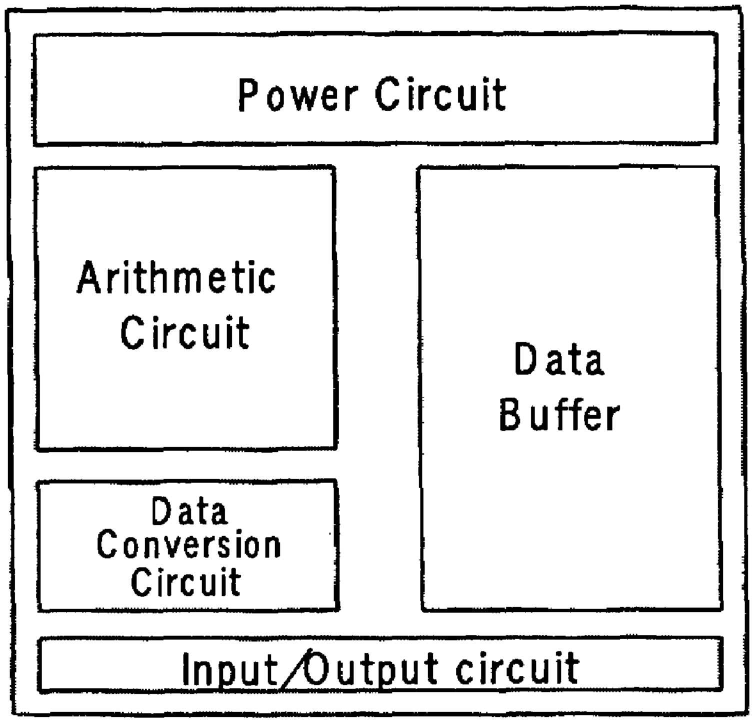
FIGS. 10(*a*) and (*b*) are views schematically illustrating the circuit scale of a large scale integrated circuit (LSI)
Figure 10:
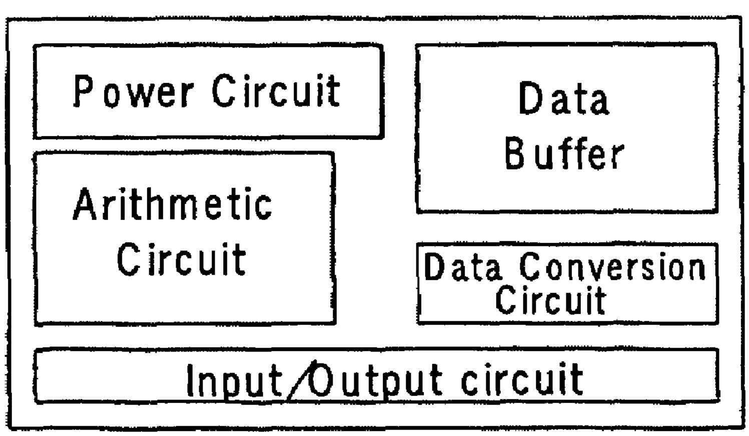

FIG. 10 is a view schematically illustrating the circuit scale of a large scale integrated circuit. FIG. 10(*a*) shows a large scale integrated circuit (LSI) employing a known nonvolatile flip-flop circuit. FIG. 10(*b*) shows a large scale integrated circuit (LSI) employing the nonvolatile flip-flop circuit of the invention. FIG. 10(*b*) shows that the circuit scale of a large scale integrated circuit is reduced by the invention.

As described above, the configuration of this embodiment also has the advantage of requiring no negative power supply. More specifically, in order to store binary data in a ferroelectric gate transistor, there is the necessity of inputting the binary data to the gate as a positive electric potential or a negative one, which may cause a problem that a negative power supply is required in addition to a positive power supply. In contrast, the configuration of this embodiment does not require a negative power supply. This is because, when a signal taking either one of the binary value, 0V or a finite potential, is inputted, data can be written and rewritten by converting the potential applied to the ferroelectric layer of the ferroelectric gate transistor 401 into a finite potential taking the binary value, each having the opposite sign. The configuration of this embodiment described above employs the resistive element for dividing the resistance. However, a circuit with no resistive element may possibly be formed when a ferroelectric gate transistor 401 with high performance is employed.

Figure 11:
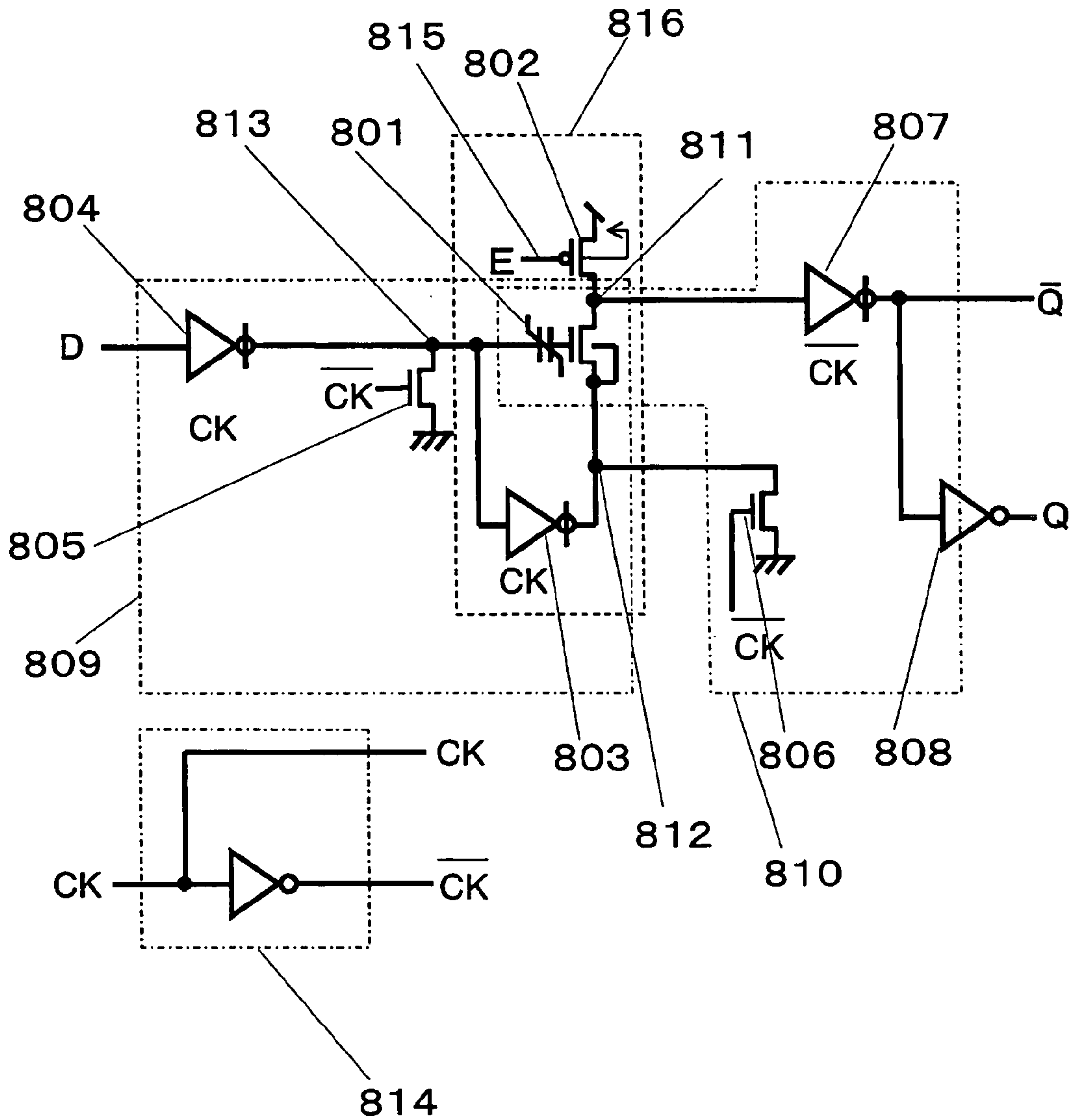
FIG. 11 is a circuit diagram showing a modified example of the nonvolatile flip-flop circuit shown in FIG. 5.

Next, a modified example of the nonvolatile flip-flop circuit shown in FIG. 5 is described with reference to FIG. 11. FIG. 11 shows a nonvolatile flip-flop circuit shown in FIG. 5 is provided with a depletion p-channel MOSFET instead of the resistive element 502 of the nonvolatile inverter 515. Hereinafter, the configuration of the flip-flop circuit shown in FIG. 11 is described.

A source and a body of a ferroelectric gate transistor 801 are connected electrically, and a drain of the ferroelectric gate transistor 801 and a depletion p-channel MOSFET 802 are connected in series. The source of the depletion p-channel MOSFET 802 is connected to the power supply. This power supply is connected electrically to the body. An operation interruption signal E is input to the gate of the depletion p-channel MOSFET 802.

In this configuration, a potential applied to the gate of the ferroelectric gate transistor 801 serves as an input and a potential 811 at a connected node of the ferroelectric gate transistor 801 and the depletion p-channel MOSFET 802 serves as an output.

The input of the ferroelectric gate transistor 801 and the input of a clocked inverter 803 are in parallel, and the output of the clocked inverter 803 is connected to the source of the ferroelectric gate transistor 801. The portion including these components serves as a nonvolatile inverter 816. According to the nonvolatile inverter 816, when a signal taking either one of the binary value, a ground potential or a positive power supply potential, is input, data can be written and rewritten by converting the potential applied to the ferroelectric material of the ferroelectric gate transistor 801 into a finite potential taking the binary value, each having the opposite sign.

A clocked inverter 804 is provided in the former stage of the input of the nonvolatile inverter 816. A drain of an n-channel MOSFET 805 in which a source is grounded is connected between the clocked inverter 804 and the nonvolatile inverter 816. A drain of an n-channel MOSFET 806 in which a source is grounded is connected to a source of the nonvolatile inverter 816. A clocked inverter 807 is provided in the later stage of the output of the nonvolatile inverter 816. An inverter 808 is provided in the later stage of the clocked inverter 807.

In this flip-flop circuit, the portion including the clocked inverter 804, the n-channel MOSFET 805, and the nonvolatile inverter 816 is a master latch 809. The nonvolatile inverter 816 is provided with the ferroelectric gate transistor 801, the depletion p-channel MOSFET 802, and the clocked inverter 803. In contrast, the portion including the n-channel MOSFET 806, the clocked inverter 807, and the ferroelectric gate transistor 801 is a slave latch 810.

In the configuration shown in FIG. 11, this flip-flop circuit can be used as a master-slave flip-flop by inverting clock signals supplied to the master latch 809 and the slave latch 810. In the nonvolatile flip-flop circuit shown in FIG. 11, a clock signal is input by a clock circuit 814. It is not always necessary that a separate clock circuit 814 be provided for each flip-flop circuit, and a configuration such that a clock signal is supplied from an external element is acceptable.

To a gate 815 of the depletion p-channel MOSFET 802 is generally applied a potential which is such that the channel resistance value of the depletion p-channel MOSFET 802 is higher than that of the ferroelectric gate transistor 801 in a low resistance state; the channel resistance value of the depletion p-channel MOSFET 802 is lower than that of the ferroelectric gate transistor 801 in a high resistance state; and as a result of the resistance distribution, the potential output to the connected node 811 of the depletion p-channel MOSFET 802 and the ferroelectric gate transistor 801 may take the opposite logic value to the signal input to the ferroelectric gate transistor 801. This potential is much closer to the ground potential than the power supply potential because a depletion p-channel MOSFET 802 is employed.

As an input voltage to the gate of the depletion p-channel MOSFET 802, a fixed voltage is always able to be applied thereto so that a given resistance may result, or a high voltage may be temporarily applied in the transition stage between the first half of a clock signal and the second half thereof.

Writing and reading-out operations of a flip-flop circuit can be interrupted under the control of the operation interruption signal E when the operations are not required. The value of the operation interruption signal E is generally closer to the value of the power supply potential than that of the ground potential because a potential which greatly raises the channel resistance of the depletion p-channel MOFET is used.

The phase of the clock signals input to the clocked inverter and the n-MOSFET is shown by "CK" and "−CK" ($\overline{\text{CK}}$) shown for each element of FIG. 11. The phase of "$\overline{\text{CK}}$" is inverted 180 degrees to that of "CK".

In the circuit configuration shown in FIG. 11 in which the resistive element comprises the depletion p-channel MOSFET 802, data preceding power supply interruption can be read out when power supply is returned after removing it temporarily. Thus, the effect of reducing power consumption can also be achieved in this configuration as in the circuit configurations shown in FIGS. 5 and 6 described above because data can be read out simply by supplying power only to a read-out circuit.

The resistive element as described above, one end of which is connected to the input terminal of the clocked inverter 807 in the slave latch 810 and the other end thereof is grounded, is not limited to the resistive element 502 shown in FIG. 5, and the depletion p-channel MOSFET of this embodiment is preferable.

Various embodiments of the present invention are described above; however, the present invention is not limited to these and various modifications are acceptable. For example, in the nonvolatile flip-flop circuit shown in FIG. 6, a nonvolatile flip-flop circuit can be constituted by using a flip-flop instead of the second clocked inverter 603 provided in the nonvolatile inverter 616.

Figure 12:
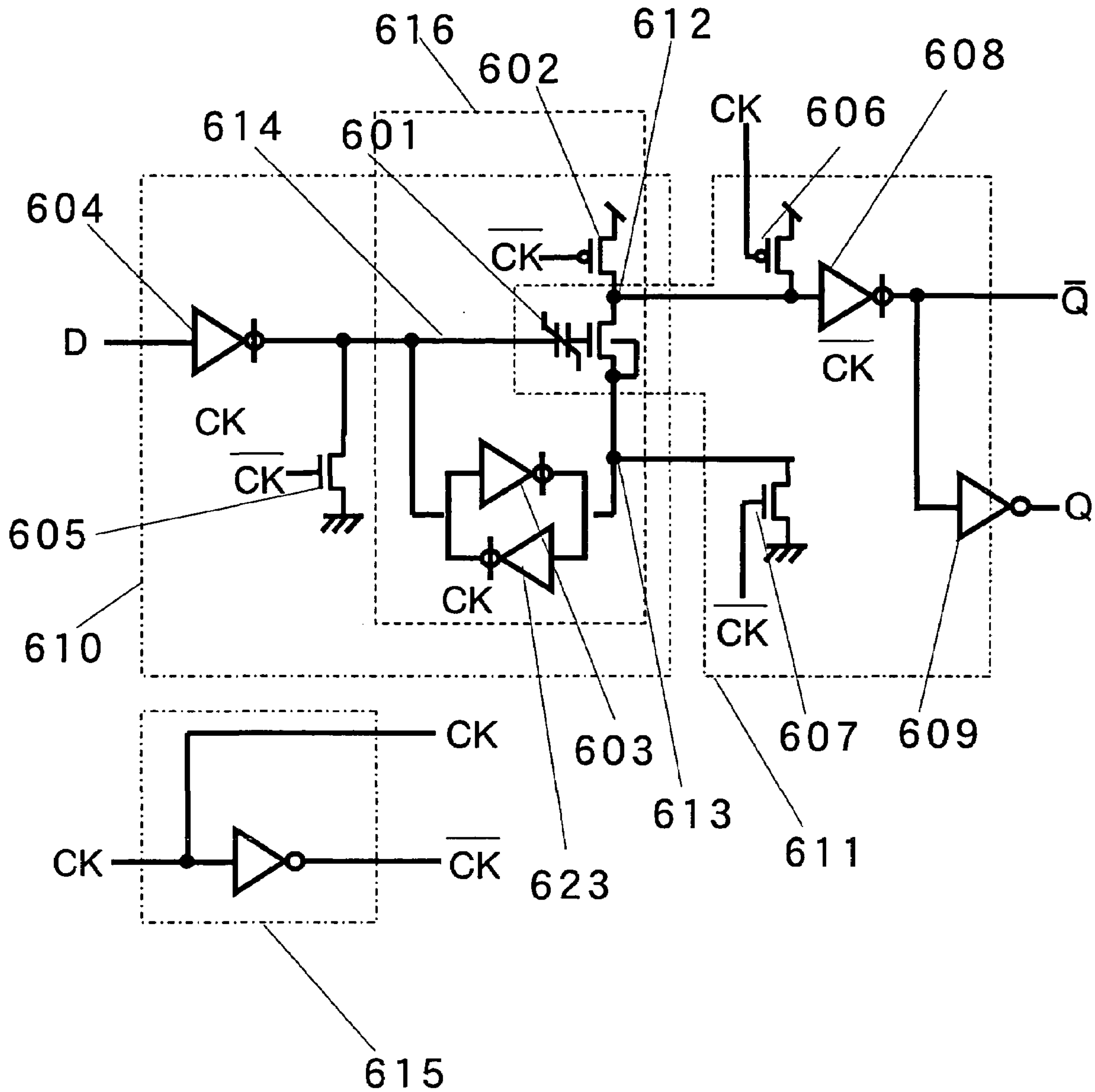
FIG. 12 is a circuit diagram showing a modified example of the nonvolatile flip-flop circuit shown in FIG. 6.

More specifically, as shown in FIG. 12, a positive feedback circuit may be constituted by further providing a fourth clocked inverter 623 whose input terminal is connected to an output terminal of the second clocked inverter 603 and whose output terminal is connected to an input terminal of the second clocked inverter 603. In this configuration, the effect of reducing power consumption can also be achieved by the same operation as in the nonvolatile flip-flop circuit shown in FIG. 6. Similarly, in the nonvolatile flip-flop circuit shown in FIG. 5, another clocked inverter may also be additionally provided in addition to the second clocked inverter 503 in such a manner to form a feedback circuit.

INDUSTRIAL APPLICABILITY

As described above, the present invention can provide a nonvolatile flip-flop circuit which can reduce power consumption, and a method of driving the same.

What is claimed is:

1. A method of driving a nonvolatile flip-flop circuit, the nonvolatile flip-flop circuit comprising:

- a first clocked inverter to which a data signal is input;
- a ferroelectric gate transistor in which a gate is connected to an output terminal of the first clocked inverter, and a source and a body are connected electrically;
- a second clocked inverter which is connected in parallel to the ferroelectric gate transistor;
- a first switching element, one end of which is connected to the gate of the ferroelectric gate transistor and the other end of which is connected to a low potential line;
- a second switching element, one end of which is connected to the source of the ferroelectric gate transistor and the other end of which is connected to the low potential line;
- a third clocked inverter which is connected to a drain of the ferroelectric gate transistor;

a third switching element, one end of which is connected to an input terminal of the third clocked inverter and the other end of which is connected to a power supply; and a fourth switching element, one end of which is connected to the input terminal of the third clocked inverter and the other end of which is connected to the power supply;

wherein an output signal is output via an output terminal of the third clocked inverter;

the driving method comprising the following steps of:

a data hold step of holding the data signal utilizing polarization of a ferroelectric material of the ferroelectric gate transistor when the data signal is input while the first clocked inverter, the second clocked inverter, and the third switching element are turned on and the first switching element, the second switching element, and the third clocked inverter are turned off; and a data output step of outputting the output signal based on the held data signal placing the first clocked inverter, the second clocked inverter, and the third switching element in the OFF state and placing the first switching element, the second switching element, and the third clocked inverter in the ON state so as to interrupt an input of a data signal and maintain a polarization state of the ferroelectric material of the ferroelectric gate transistor.

2. A method of driving a nonvolatile flip-flop circuit according to claim 1, wherein a channel resistance value of the ferroelectric gate transistor in the ON state is sufficiently smaller than both resistance values of the third switching element and the fourth switching element in the ON state; and a channel resistance value of the ferroelectric gate transistor in the OFF state is sufficiently larger than both resistance values of the third switching element and the fourth switching element in the ON state.

3. A method of driving a nonvolatile flip-flop circuit according to claim 1, wherein the first switching element and the second switching element are an n-channel MOSFET; and the third switching element and the fourth switching element are a p-channel MOSFET; and wherein in the data hold step, a clock signal which state is "high" is input to the first clocked inverter and the second clocked inverter, and simultaneously an inverted clock signal which state is "low" is input to the first switching element, the second switching element, the third switching element, and the third clocked inverter; and in the data output step, a clock signal which state is "low" is input to the first clocked inverter and the second clocked inverter, and simultaneously an inverted clock signal which state is "high" is input to the first switching element, the second switching element, the third switching element, and the third clocked inverter.

4. A method of driving a nonvolatile flip-flop circuit according to claim 3, further comprising a clock circuit which outputs the clock signal and the inverted clock signal at the same time.

5. A method of driving a nonvolatile flip-flop circuit according to claim 1, further comprising an output inverter which is connected to the output terminal of the third clocked inverter.

6. A method of driving a nonvolatile flip-flop circuit according to claim 1, further comprising a fourth clocked inverter, wherein an input terminal of the fourth clocked inverter is connected to an output terminal of the second clocked inverter and an output terminal thereof is connected to an input terminal of the second clocked inverter in such a manner to form a feedback circuit.

7. A flip-flop circuit comprising:

a first clocked inverter to which a data signal is input;

a ferroelectric gate transistor in which a gate is connected to an output terminal of the first clocked inverter, and a source and a body are connected electrically;

a second clocked inverter which is connected in parallel to the ferroelectric gate transistor;

a first switching element, one end of which is connected to the gate of the ferroelectric gate transistor and the other end of which is connected to a low potential line;

a second switching element, one end of which is connected to the source of the ferroelectric gate transistor and the other end of which is connected to the low potential line;

a third clocked inverter which is connected to a drain of the ferroelectric gate transistor;

a third switching element, one end of which is connected to an input terminal of the third clocked inverter and the other end of which is connected to a power supply; and a fourth switching element, one end of which is connected to the input terminal of the third clocked inverter and the other end of which is connected to the power supply;

wherein an output signal is output via an output terminal of the third clocked inverter.

8. A nonvolatile flip-flop circuit according to claim 7, wherein a channel resistance value of the ferroelectric gate transistor in the ON state is sufficiently smaller than both resistance values of the third switching element and the fourth switching element in the ON state, and a channel resistance value of the ferroelectric gate transistor in the OFF state is sufficiently larger than both resistance values of the third switching element and the fourth switching element in the ON state.

9. A flip-flop circuit according to claim 7, wherein the first switching element and the second switching element are an n-channel MOSFET; and the third switching element and the fourth switching element are a p-channel MOSFET; wherein when a clock signal which state is "high" is input to the first clocked inverter and the second clocked inverter, an inverted clock signal which state is "low" is input to the first switching element, the second switching element, the third switching element, and the third clocked inverter; and when a clock signal which state is "low" is input to the first clocked inverter and the second clocked inverter, an inverted clock signal which state is "high" is input to the first switching element, the second switching element, the third switching element, and the third clocked inverter.

10. A nonvolatile flip-flop circuit according to claim 9, further comprising a clock circuit which outputs the clock signal and the inverted clock signal at the same time.

11. A method of driving a nonvolatile flip-flop circuit according to claim 7, further comprising an output inverter which is connected to the output terminal of the third clocked inverter.

12. A nonvolatile flip-flop circuit according to claim 7, further comprising a fourth clocked inverter, wherein an input terminal of a fourth clocked inverter is connected to an output terminal of the second clocked inverter and an output terminal thereof is connected to an input terminal of the second clocked inverter in such a manner to form a feedback circuit.

13. A shift register circuit wherein a plurality of flip-flop circuits according to claim 7 are connected.

14. A frame buffer circuit comprising at least one shift register circuit according to claim 13.

15. A method of driving a nonvolatile flip-flop circuit, the nonvolatile flip-flop circuit comprising:

a first clocked inverter to which a data signal is input;

a ferroelectric gate transistor in which a gate is connected to an output terminal of the first clocked inverter, and a source and a body are connected electrically;

a second clocked inverter which is connected in parallel to the ferroelectric gate transistor;

a first switching element, one end of which is connected to the gate of the ferroelectric gate transistor and the other end of which is connected to a low potential line;

a second switching element, one end of which is connected to the source of the ferroelectric gate transistor and the other end of which is connected to the low potential line;

a third clocked inverter, one end of which is connected to a drain of the ferroelectric gate transistor;

a resistive element, one end of which is connected to an input terminal of the third clocked inverter and the other end of which is connected to a power supply; wherein an output signal is output via an output terminal of the third clocked inverter;

the driving method comprising the following steps of:

a data hold step of holding the data signal utilizing polarization of a ferroelectric material of the ferroelectric gate transistor when the data signal is input while the first clocked inverter and the second clocked inverter are turned on and the first switching element, the second switching element, and the third clocked inverter are turned off; and a data output step of outputting the output signal based on the held data signal placing the first clocked inverter and the second clocked inverter in the OFF state and placing the first switching element, the second switching element, and the third clocked inverter in the ON state so as to interrupt an input of a data signal and maintain a polarization state of the ferroelectric material of the ferroelectric gate transistor.

16. A method of driving a nonvolatile flip-flop circuit according to claim 15, wherein a channel resistance value of the ferroelectric gate transistor in the ON state is sufficiently smaller than a resistance value of the resistive element and a channel resistance value of the ferroelectric gate transistor in the OFF state is sufficiently larger than a resistance value of the resistive element.

17. A method of driving a nonvolatile flip-flop circuit according to claim 15, wherein the first switching element and the second switching element are an n-channel MOSFET; and wherein in the data hold step, a clock signal which state is "high" is input to the first clocked inverter and the second clocked inverter, and simultaneously an inverted clock signal which state is "low" is input to the first switching element, the second switching element, and the third clocked inverter; and in the data output step, a clock signal which state is "low" is input to the first clocked inverter and the second clocked inverter, and simultaneously an inverted clock signal which state is "high" is input to the first switching element, the second switching element, and the third clocked inverter.

18. A method of driving a nonvolatile flip-flop circuit according to claim 17, further comprising a clock circuit which outputs the clock signal and the inverted clock signal at the same time.

19. A method of driving a nonvolatile flip-flop circuit according to claim 15, further comprising an output inverter which is connected to an output terminal of the third clocked inverter.

20. A method of driving a nonvolatile flip-flop circuit according to claim 15, further comprising a fourth clocked inverter, wherein an input terminal of the fourth clocked inverter is connected to an output terminal of the second clocked inverter and an output terminal thereof is connected to an input terminal of the second clocked inverter in such a manner to form a feedback circuit.

21. A method of driving a nonvolatile flip-flop circuit according to claim 15, wherein the resistive element is comprised of a depletion p-channel MOSFET, the depletion p-channel MOSFET being configured so that a voltage is applied to a gate in such a manner that a channel resistance value is sufficiently larger than the channel resistance value of the ferroelectric gate transistor in the ON state and the channel resistance value is sufficiently smaller than the channel resistance value of the ferroelectric gate transistor in the OFF state.

22. A nonvolatile flip-flop circuit, comprising:

a first clocked inverter to which a data signal is input;

a ferroelectric gate transistor in which a gate is connected to an output terminal of the first clocked inverter, and a source and a body are connected electrically;

a second clocked inverter which is connected in parallel to the ferroelectric gate transistor;

a first switching element, one end of which is connected to the gate of the ferroelectric gate transistor and the other end of which is connected to a low potential line;

a second switching element, one end of which is connected to the source of the ferroelectric gate transistor and the other end of which is connected to the low potential line;

a third clocked inverter which is connected to a drain of the ferroelectric gate transistor; and a resistive element, one end of which is connected to an input terminal of the third clocked inverter and the other end of which is connected to a power supply; wherein an output signal is output via an output terminal of the third clocked inverter.

23. A nonvolatile flip-flop circuit according to claim 22, wherein a channel resistance value of the ferroelectric gate transistor in the ON state is sufficiently smaller than the resistance value of the resistive element and the channel resistance value of the ferroelectric gate transistor in the OFF state is sufficiently larger than the resistance value of the resistive element.

24. A nonvolatile flip-flop circuit according to claim 22, wherein the first switching element and the second switching element are an n-channel MOSFET; and wherein when a clock signal which state is "high" is input to the first clocked inverter and the second clocked inverter, an inverted clock signal which state is "low" is input to the first switching element, the second switching element, and the third clocked inverter; and when a clock signal which state is "low" is input to the first clocked inverter and the second clocked inverter, an inverted clock signal which state is "high" is input to the first switching element, the second switching element, and the third clocked inverter.

25. A nonvolatile flip-flop circuit according to claim 24, further comprising a clock circuit which outputs the clock signal and the inverted clock signal at the same time.

26. A nonvolatile flip-flop circuit according to claim 22, further comprising an output inverter which is connected to an output terminal of the third clocked inverter.

27. A nonvolatile flip-flop circuit according to claim 22, further comprising a fourth clocked inverter, wherein an input terminal of the fourth clocked inverter is connected to an output terminal of the second clocked inverter and an output terminal thereof is connected to an input terminal of the second clocked inverter in such a manner to form a feedback circuit.

28. A nonvolatile flip-flop circuit according to claim 22, wherein the resistive element is comprised of a depletion p-channel MOSFET, the depletion p-channel MOSFET being configured so that a voltage is applied to a gate in such a manner that the channel resistance value is sufficiently larger than the channel resistance value of the ferroelectric gate transistor in the ON state and the channel resistance value is sufficiently smaller than the channel resistance value of the ferroelectric gate transistor in the OFF state.

29. A shift register circuit wherein a plurality of flip-flop circuits according to claim 22 are connected.

30. A frame buffer circuit comprising at least one shift register circuit according to claim 29.

* * * * *

UNITED STATES PATENT AND TRADEMARK OFFICE

CERTIFICATE OF CORRECTION

PATENT NO. : 7,002,388 B2

APPLICATION NO. : 11/080454
DATED : February 21, 2006
INVENTOR(S) : Takashi Nishikawa et al.

It is certified that error appears in the above-identified patent and that said Letters Patent is hereby corrected as shown below:

Title page,
Item [73], Assignee, change "Matsushita Electric Co., Ltd." to -- Matsushita Electric Industrial Co., Ltd. --.

Signed and Sealed this

Twenty-seventh Day of June, 2006

JON W. DUDAS
*Director of the United States Patent and Trademark Office*